United States Patent
Kitamura et al.

(10) Patent No.: US 6,673,330 B1
(45) Date of Patent: Jan. 6, 2004

(54) SINGLE CRYSTAL OF LITHIUM NIOBATE OR TANTALATE AND ITS OPTICAL ELEMENT, AND PROCESS AND APPARATUS FOR PRODUCING AN OXIDE SINGLE CRYSTAL

(75) Inventors: Kenji Kitamura, Ibaraki (JP); Yasunori Furukawa, Ibaraki (JP); Shunji Takekawa, Ibaraki (JP); Shigeyuki Kimura, Ibaraki (JP)

(73) Assignee: National Institute for Research in Inorganic Materials, Tsukuba (JP)

( * ) Notice: Subject to any disclaimer, the term of this patent is extended or adjusted under 35 U.S.C. 154(b) by 0 days.

(21) Appl. No.: 09/521,899

(22) Filed: Mar. 9, 2000

(30) Foreign Application Priority Data

Mar. 26, 1999 (JP) .......................... 11-084999
Nov. 9, 1999 (JP) .......................... 11-317565
Nov. 9, 1999 (JP) .......................... 11-317572

(51) Int. Cl.$^7$ .................. C01D 15/00; C01G 33/00; C01G 35/00
(52) U.S. Cl. .................. 423/594.8; 423/263; 423/275; 117/948; 359/237
(58) Field of Search .................. 423/263, 275, 423/593, 593.1, 594.8; 252/582; 359/237, 238, 278, 279, 321, 322, 326, 328, 246; 117/948

(56) References Cited

U.S. PATENT DOCUMENTS

| | | | |
|---|---|---|---|
| 3,665,205 A | * 5/1972 | Bridenbaugh et al. | 359/328 |
| 5,209,917 A | * 5/1993 | Ohno et al. | 423/593 |
| 5,274,727 A | * 12/1993 | Ito et al. | |
| 5,315,432 A | * 5/1994 | Ohno | 359/326 |
| 5,359,452 A | * 10/1994 | Nitanda et al. | 423/275 |
| 5,650,006 A | * 7/1997 | Kawaguchi et al. | |
| 5,763,055 A | * 6/1998 | Kawaguchi et al. | |
| 5,904,912 A | * 5/1999 | Kitamura et al. | 423/275 |
| 6,074,477 A | * 6/2000 | Imaeda et al. | 117/13 |
| 6,117,346 A | * 9/2000 | Kawaguchi et al. | |
| 6,211,999 B1 | * 4/2001 | Goplalan et al. | |
| 6,353,495 B1 | * 3/2002 | Mizuuchi et al. | |

FOREIGN PATENT DOCUMENTS

| JP | 4-325496 | * 11/1992 |
|---|---|---|
| JP | 6-16500 | * 1/1994 |

OTHER PUBLICATIONS

Iyi, et al., "Defect structure model of MgO–doped LiNbO3" J. Solid State Chemistry 118, 148–152, 1995, no month.*
English abstract of Japan 53–106700, Sep. 1978.*
English abstract of Japan 9–280466, Feb. 1999.*

(List continued on next page.)

*Primary Examiner*—Steven Bos
(74) *Attorney, Agent, or Firm*—Oblon, Spivak, McClelland, Maier & Neustadt, P.C.

(57) ABSTRACT

A single crystal of lithium niobate or lithium tantalate may be grown from a melt of a composition having a molar excess of Li compared to a melt having the stoichiometric amount of lithium, and having a molar fraction of $Li_2O/(Nb_2O_5+Li_2O)$ or $Li_2O/(Ta_2O_5+Li_2O)$ within a range of at least 0.490 and less than 0.500. The single crystal also has at least one element selected from the group consisting of Mg, Zn, Sc and In, in an amount of from 0.1 to 3.0 mol % based on the total amount of the elements, Nb and Li, or the total amount of the elements, Ta and Li.

18 Claims, 4 Drawing Sheets

OTHER PUBLICATIONS

M. Yamada, et al., Appl. Phys. Lett., vol. 69, No. 24, pps. 3659–3661, "Electric–Field Induced Cylindrical Lens, Switching and Deflection Devices Composed of the Inverted Domains in $LiNbO_3$ Crystals," Dec. 9, 1996.

D.A. Bryan, et al., Appl. Phys. Lett., vol. 44, No. 9, pps. 847–849, "Increased Optical Damage Resistance in Lithium Niobate," May 1, 1984.

F. Nitanda, et al., Jpn, J. Appl. Phys., vol. 34, No. 3, pps. 1546–1549, "Increased Optical Damage Resistance and Transparency in MgO–Doped $LiTaO_3$ Single Crystal," Mar. 1995.

I. Shoji, et al., J. Opt. Soc. Am., vol. 14, No. 9, pps. 2268–2294, "Absolute Scale of Second–Order Nonlinear–Optical Coefficients," Sep. 1997.

V. Gopalan, et al., Applied Physics Letters, vol. 72, No. 16, pps. 1981–1983, "The Role of Nonstoichiometry in 180° Domain Switching of $LiNbO_3$ Crystals," Apr. 20, 1998.

K. Kitamura, et al., Applied Physics Letters, vol. 73, No. 21, pps. 3073–3075, "Crystal Growth and Low Coercive Field 180° Domain Switching Characteristics of Stoichiometric $LiTaO_3$," Nov. 23, 1998.

G.I. Malovichko, et al., Applied Physics, vol. 56, pps. 103–108, "Characterization of Stoichiometric $LiNbO_3$ Grown From Melts Containing $K_2O$," 1993, no month.

S. Miyazawa, Journal of Crystal Growth, vol. 10, pps. 276–278, "Congruent Melting Composition of Lithium Metatantalate," 1971, no month.

Y. Furukawa, et al., Journal of Crystal Growth, vol. 197, pps. 889–895, "Stoichiometric $LiTaO_3$ Single Crystal Growth by Double Crucible Czochralski Method Using Automatic Powder Supply System." 1999, no month.

K. Kitamura, et al., Journal of Crystal Growth, vol. 116, pps. 327–332, "Stoichiometric $LiNbO_3$ Single Crystal Growth by Double Crucible Czochralski Methos Using Automatic Powder Supply System." 1992, no month.

K. Kitamura, et al., National Institute for Research in Inorganic Materials, vol. 65, No. 9, pps. 931–935, "Nonstoichiometric Defects and Optical Properties of $LiNbO_3$," 1996, no month, Untranslated Japanese document.

Shoji, et al., Absolute scale of second–order nonlinear–optical coefficients, Sep. 1997, J. Opt. Soc. Am. B/vol. 14, No.9, pp. 2268–2295.

D.A. Bryan, et al., Magnesium–doped lithium niobate for higher optical power applications, Jan./Feb. 1985, Optical Engineering., vol. 24 No. 1, pp. 138–143.

B.C. Grabmaier, et al., Large Lithium Niobate Crystals, 1988,, Siemens Forsch.–u. Entwickl.–Ber. Bd. 17 (1988) Nr. 3, pp. 159–164, no month.

J.R. Carruthers, et al., Nonstoichiometry and Crystal Growth of Lithium Niobate,Apr. 1971, Journal of Applied Physics, vol. 42, No. 5, pp. 1946–1851.

K. Kitamura, et al., Stoichiometric $LiNbO_3$ single crystal growth by double crucible Czochralski method using automatic powder supply system,1992, Journal of Crystal Growth 116, pp. 327–332, no month.

Kenji Kitamura, et al., Crystal growth and low coercive field 180° domain switching characteristics of stoichiometric $LiTaO_3$, Nov. 23, 1998, Applied Physics Letters, vol. 73, No. 21, pp. 3073–3075.

Yukiko Kondo, et al., An Increase of More Than 30% in the Electrooptic coefficients of Fe–Doped and Ce–Doped Stoichiometric $LiNbO_3$ Crystals, 2000, Jpn J. Appl Phys. vol. 39 (2000), pp. 1477–1480.

Y. Furukawa, et al., The Correlation of MgO–doped near––stoichiometric $LiNbO_3$ composition to the defect structure, 2000, Journal of Crystal Growth 211 (2000), pp. 230–236, no month.

Yasunori Furukawa, et al., Elimination of photorefraction and green–induced–infrared–absorption in MgO–doped Near–stoichiometric $LiNbO_3$, pp. 480–484, (References 1992, 1998, 1999, 2000, No date.

Yasunori Furukawa, et al., Journal of Crystal Growth, 1999, Journal of Crystal Growth 197 (1999) pp. 889–895, no month.

Venkatraman, et al., The role of nonstoichiometry in 180° domain switching of $LiNbO_3$ crystals, Applied Physics Letters vol. 72, No. 16, Apr. 20, 1998, pp. 1981–1983.

* cited by examiner

CRYSTAL WEIGHT MEASURING SYSTEM

DOUBLE CRUCIBLE

APPARATUS FOR CONTROLLING THE MATERIAL SUPPLY

SINGLE CRYSTAL OF LITHIUM NIOBATE OR TANTALATE AND ITS OPTICAL ELEMENT, AND PROCESS AND APPARATUS FOR PRODUCING AN OXIDE SINGLE CRYSTAL

BACKGROUND OF THE INVENTION

1. Field of the Invention

The present invention relates to a single crystal of lithium niobate or tantalate for optical use and its production method, an optical element using the single crystal and its production method. Particularly, it relates to a production method for stable growing a single crystal of its stoichiometric composition, which has excellent physical properties and which is used for an element utilizing polarization inversion, from a melt having a high Li concentration.

The present invention further relates to a process and an apparatus for producing an oxide single crystal by using a noble metal crucible of a double crucible structure. Particularly, it relates to a process and an apparatus for producing an oxide single crystal for stably growing a high quality and longitudinal crystal by rotation pulling.

2. Discussion of Background

Functional optical single crystals of which optical characteristics can be controlled by an information signal from outside such as electricity, light of stress, are now essential materials in various optoelectronics fields including optical communication, recording, measurement and optical-optical control. Particularly with respect to a certain single crystal of an oxide, the interaction between the optical characteristics and external factors is significant, and it is thereby used as a frequency-conversion element utilizing the nonlinear optical effect, or as an optical element utilizing the electrooptical effect, such as an electrooptical light modulator, a switch or a reflector.

Such a crystal is used as an element as it is originally grown, in many cases. However, with respect to some ferroelectric crystals, the directions of the dielectric polarization can be inverted by applying voltage thereto without destroying the crystals, and accordingly, their functions have been increased by inverting the polarization periodically.

For example, with respect to a frequency-conversion element, the wavelength can be converted by means of quasi-phase-matching (QPM) by periodically inverting the domain structure of the ferroelectric polarization. This method is effective from the viewpoint that the conversion can be carried out with a high efficiency at a wide wavelength range, and it is thereby expected as a frequency-conversion element to realize a laser light source having a wide range of wavelength covering from the ultraviolet and visible light region to the infrared light region, which is strongly desired in fields including optical communication, recording, measurement and medical care.

Further, with respect to an electrooptical element, according to a known literature (M. Yamada et al., Appl. Phys. Lett., 69, page 3659, 1996), an attention has been drawn to a cylindrical lens, a beam scanner and a switch, and an optical element forming a polarization inversion structure of a lens or a prism in a ferroelectric crystal, and polarizing laser light transmitted therethrough by utilizing the electrooptical effect, as new optical elements.

A single crystal of $LiNbO_3$ or $LiTaO_3$ (hereinafter referred to simply as LN single crystal or LT single crystal, respectively) is a ferroelectric which is used mainly as a substrate for a surface elastic wave element or for an electrooptical light modulator. It is transparent at a wide wavelength range of from the visible region to the infrared region, it can form a periodic polarization structure by applying voltage, it has optical nonlinearity and electrooptical characteristics which are practical to some extent, and further, a single crystal having a large diameter and a high composition homogeneity can be provided at a relatively low cost. Accordingly, an attention has been drawn to the LN single crystal or the LT single crystal also as a substrate for a frequency-conversion element by the above-mentioned QPM (hereinafter referred to simply as QPM element) or for an electrooptical element.

Heretofore, the LN single crystal available has been limited to one of the congruent melting composition with a molar fraction of $Li_2O/(Nb_2O_5+Li_2O)$ of 0.485, containing nonstoichiometric defects of a level of several percent, including the substrate for a surface acoustic wave element, since the phase diagram of the LN single crystal has been known for a long time, and it has been conventionally considered that to produce a LN single crystal having a high composition homogeneity, it is preferred to grow the single crystal by rotation pulling from a melt with a molar fraction of $Li_2O/(Nb_2O_5+Li_2O)$ of 0.485, which is of the congruent melting composition wherein the crystal and the melt are coexist in equilibrium state with the same composition. Further, as shown in a known literature (D. A. Bryan et al. Appl. Phys. Lett. 44, page 847, 1984), Mg is added in an amount of at least 4.5 mol % to the LN crystal of the congruent melting composition, with a purpose of increasing optical damage resistance. For the LT single crystal available has been limited to one of the congruent melting composition with a molar fraction of $Li_2O/(Ta_2O_5+Li_2O)$ of 0.483, containing nonstoichiometric defects of a level of several percent, including the substrate for a surface acoustic wave element, since it has been conventionally considered that to produce a LT single crystal having a high composition homogeneity, it is preferred to grow the single crystal by rotation pulling from a melt with a molar fraction of $Li_2O/(Ta_2O_5+Li_2O)$ of 0.483, which is of the congruent melting composition wherein the crystal and the melt are coexist in equilibrium state with the same composition. Further, as shown in a known literature (F. Nitanda et al. Jpn. J. Appl. Phys. 34, page 1546, 1995), Mg is added in an amount of a level of several mol % to the LT crystal of the congruent melting composition, with a purpose of increasing optical damage resistance or shortening the cut-off wavelength. However, it has been known that the LT single crystal has a relatively high optical damage resistance even without Mg addition, as compared with the LN single crystal, and an adequate effect of improving the optical damage resistance by Mg addition is not always obtained.

In order to realize the QPM element, it is important to prepare a small element having a high efficiency. Downsizing and obtaining high efficiency of the element are significantly dependent on the characteristics of the material to be used, i.e. the material characteristics which the crystal essentially has, although they are greatly dependent on also the structure of the element. For example, the conversion efficiency of the QPM element is in proportion to the square of the nonlinear optical constant and the interaction length, and is in proportion to the fundamental wave power density. The interaction length and the fundamental wave power density are determined by the element design or accuracy of the preparation process, and may be increased by e.g. improvement of techniques. On the other hand, the nonlinear optical constant is a material characteristic which the material essentially has. Since LN is one of the most popular nonlinear optical materials, a large number of measurements of the nonlinear optical constant have been carried out for a long time. Of the LN crystals of the congruent melting composition which have been reported so far, the nonlinear optical constant $d_{33}$ has been said to be usually from about 27 to about 34 pm/V at a wavelength of 1.064 μm. However, the difference among reported values is surprisingly large, and it is twice between the highest and the smallest. These values are obtained by a relative measurement for obtaining the ratio in the nonlinear optical constant with a reference substance. However, the absolute value of the reference substance itself is not determined, and researchers use different values, and the difference is thereby so large. In the conventional measurement methods, the absolute value of the reference substance is based on the value obtained by absolute measurement for directly measuring the absolute value of the nonlinear optical constant. However, there is a significant difference in the obtained value between second harmonic generation (SHG) method and parametric fluorescence (PF) method which are representative absolute measurement methods. For example, $d_{11}$ of quartz is 0.3 pm/V according to the absolute value scale based on SHG method, whereas it is 0.5 pm/V based on PF method, at a fundamental wavelength of 1.064 μm. The absolute value of the nonlinear optical constant has been inadequate, and according to a known literature (I. Shoji et al., J. Opt. Soc. Am. B, 14, page 2268, 1997) for example, it has been known by careful absolute measurements by both SHG method and PF method, that the values by PF method which have been reported so far, were overestimated since e.g. influences of stray light at the time of measurement can not be completely excluded, and the same value can be obtainable essentially by either method. Recently, the absolute value has, at long last, become to be measured with a high accuracy, and with respect to the LN crystal of the congruent melting composition, including one having Mg added thereto, the nonlinear optical constant $d_{33}$ has been corrected and reported to be from 24.9 to 25.2 pm/V. Further, with respect to the LT crystal of the congruent melting composition, $d_{33}$ based on fundamental wave having a wavelength of 1.064 μm, has been reported to be 13.8 pm/V according to the known literature (I. Shoji et al., J. Opt. Soc. Am. B, 14, page 2268, 1997).

Further, in the case of using the LN single crystal or LT single crystal for an electrooptical element, a high electrooptical constant is desired. The LN or LT single crystal has begun to be used as a material of the substrate for an optical element utilizing various electrooptical effects, since a single crystal having a high quality and a large diameter can be stably produced at a low cost, although the electrooptical constant of the single crystal itself is not particularly high among ferroelectric single crystals. The electrooptical constant of the LN or LT single crystal has been measured usually by means of Mach-zender interferrometer. With respect to the LN single crystal of the congruent melting composition which has conventionally been used, the electrooptical constants $r_{13}$ and $r_{33}$ have been reported to be about 8.0 pm/V and about 32.2 pm/V, respectively. With respect to the LT single crystal of the congruent melting composition which has conventionally been used, the electrooptical constants $r_{13}$ and $r_{33}$ have been reported to be about 8.0 pm/V and about 32.2 pm/V, respectively. Accordingly, the structure of the element using the single crystal having a high electrooptical constant $r_{33}$, has a significant merit for downsizing and obtaining high efficiency of the element.

In recent years, studies to reduce the nonstoichiometric defects in the LN or LT single crystal of the congruent melting composition, i.e. studies to make the crystal composition ratio to be in the vicinity of the stoichiometric, has clarified that the nonstoichiometric defects decrease the nonlinear optical constant that the LN crystal essentially has, and besides, increase the applied voltage necessary for preparing a periodic polarization structure. For example, according to known literature (V. Gopalan et al. Appl. Phys. Lett. 72, page 1981, 1998), the polarization inversion voltage can be decreased to be at most 5 kV/mm by making the crystal composition to be in the vicinity of the stoichiometric composition. Likewise, the studies have been clarified that the nonstoichiometric defects increase the optical characteristics that the LT crystal essentially has, and applied voltage required for preparing a periodic polarization structure. For example, according to JP-A-11-35393, the photorefractive characteristic and the transmittance characteristic of light can be improved by making the crystal composition to be in the vicinity of the stoichiometric composition. Further, another known literature (K. Kitamura et al. Appl. Phys. Lett. 73, page 3073, 1998) reports that the polarization inversion voltage can be decreased to be a level of from 1.5 to 1.7 kV/mm by making the crystal composition to be in the vicinity of the stoichiometric composition.

Further, in order to practically utilize the LN single crystal of the stoichiometric composition, studies with respect to its growing method have been extensively made. For example, according to known literature (G. I. Molovichiko et al. Appl. Phys. A, 56, page 103, 1993), the LN crystal having a small defect density and a composition in the vicinity of the stoichiometric composition, can be obtained by growing the crystal from a melt of the congruent melting composition or the stoichiometric composition, having at least 6 mol % of $K_2O$ added thereto. Further, in order to practically utilize the LT single crystal of the stoichiometric composition, studies with respect to its growing method have been extensively made. For example, JP-A-11-35393 proposes that the LT crystal having a small defect density and a composition in the vicinity of the stoichiometric composition, can be obtained by growing the crystal from a melt of the congruent melting composition or the stoichiometric composition, having at least 6 mol % of $K_2O$ added thereto.

From a phase diagram of $Li_2O$ and $Nb_2O_5$ as shown in FIG. 2, it is known that a crystal having a molar fraction of $Li_2O/(Nb_2O_5+Li_2O)$ in the vicinity of 0.500 can be grown by making the molar fraction of $Li_2O/(Nb_2O_5+Li_2O)$ of the melt for growing to be from 0.58 to 0.60. However, as shown in the phase diagram, the melt composition ratio is extremely close to the eutectic point, and in the case where a crystal of a composition in the vicinity of the stoichiometric composition is grown from a melt of a composition having a higher Li concentration over the stoichiometric composition, the excessive Li component remains in a crucible along with the deposition of the crystal, and the composition ratio of Li and Nb in the melt gradually changes, whereby the melt composition ratio achieves the eutectic point soon after the initiation of the growing. Accordingly, in a case of employing Czochralski method (hereinafter referred to simply as CZ method) which has conventionally been used as a means of industrial mass production of a LN crystal having a large diameter, the solidification ratio of a crystal of the composition in the vicinity of the stoichiometric composition is as low as a level of 10%. Likewise, according to known literature (K. Kitamura et al. Appl. Phys. Lett. 73, page 3073, 1998), a crystal having a molar fraction of $Li_2O/(Ta_2O_5+Li_2O)$ in the vicinity of 0.5 can be grown by making the molar fraction of $Li_2O/(Ta_2O_5+Li_2O)$ of the melt for growing to be from 0.58 to 0.59. However, from a phase diagram as shown in known literature (S. Miyazawa et al. J. Crystal Growth 10, page 276, 1971), the melt composition ratio is extremely close to the eutectic point, and in a case where a crystal of a composition in the vicinity of the stoichiometric composition is grown from a melt of a composition having a higher Li concentration over the stoichiometric composition, the excessive Li component remains in a crucible along with the deposition of the crystal, and the composition ratio of Li and Ta in the melt gradually changes, whereby the melt composition ratio reaches the eutectic point soon after the initiation of the growing. Accordingly, in the case of using CZ method which have been conventionally used for industrial mass production of a LT crystal having a large diameter, the solidification ratio of the crystal is estimated to be as low as a level of 10%.

In order to raise this low solidification ratio, JP-A-10-274047 proposes a method of growing while continuously supplying starting material (hereinafter referred to simply as continuous supply method. Specifically, in the above method, the molar fraction of $Li_2O/(Nb_2O_5+Li_2O)$ in the melt for growing is adjusted to be from 0.585 to 0.595, a crucible having a double structure is employed, a crystal is pulled up from an inner crucible, and the weight of the crystal being pulled up is measured at all times to obtain the growth rate, and a powder having the same component as the crystal is continuously supplied between an outer crucible and the inner crucible in the same amount as said rate. By employing this method, a longitudinal crystal may be grown, and the crystal solidification ratio of 100% based on the amount of supplied material will be realized. Likewise, in order to raise this low solidification ratio, a continuous supply method has been reported, for example, by a known literature (Y. Furukawa et al. J. Crystal Growth 197, page 889, 1999). Specifically, in the method, the molar fraction of $Li_2O/(Ta_2O_5+Li_2O)$ in the melt for growing is adjusted to be from 58.0 to 59.0, a crucible having a double structure is employed, a crystal is pulled up from an inner crucible, and the weight of the crystal being pulled up is measured at all times to obtain the growth rate, and a powder having the same component as the crystal is continuously supplied between an outer crucible and the inner crucible in the same amount as said rate. By employing this method, a longitudinal crystal may be grown, and the crystal solidification ratio of 100% based on the amount of supplied material will be realized.

Further, the LN or LT single crystal is often used as a QPM element. As an important process technique to obtain a high efficiency, a technique of producing a periodic polarization inversion domain with a high accuracy may be mentioned. Namely, in order to obtain the maximum nonlinear optical characteristics, the ratio of the width of the polarization inversion (hereinafter referred to simply as polarization inversion width) is made to be 1:1. The polarization inversion width varies depending upon the phase matching wavelength of a frequency-conversion element to be obtained. For example, with respect to phase matching at a longer wavelength in e.g. the infrared region, the polarization inversion width is several tens $\mu$m. The polarization inversion voltage of the LT single crystal of the congruent melting composition is said to be at least 21 kV/mm according to known literature (K. Kitamura et al. Appl. Phys. Lett. 73, page 3073, 1998). Further, the polarization inversion voltage of the LN single crystal of the congruent melting composition is said to be at least 21 kV/mm.

The LN or LT single crystal of the congruent melting composition is a crystal having a high non-linearity, among existing nonlinear optical crystals. However, its non-linearity is still inadequate in the case of practically preparing an element. Along with improvement of the level of performance of element design and improvement of accuracy in the preparation process in recent years, a significant improvement of the element characteristics will no longer be expected only by improving the process, and it has thereby been desired to make the constant d itself to be a higher value.

However, it has been gradually found that crystal growing method of pulling up the crystal from a melt having a higher Li concentration over the congruent melting composition by means of continuous supply method, has a significant problem in the yield from the industrial viewpoint. Namely, the present inventors have found that the composition of the growing crystal greatly depends on the composition ratio of the melt, in the case of using a melt having a high Li concentration, different from the case where a crystal is grown from a melt of the congruent melting composition. This means that it is necessary to grow a crystal from a melt having the same composition ratio always kept, in order to grow a crystal having uniform optical characteristics and good optical homogeneity with a high reproducibility. In the case of LN or LT crystal, the nonlinear optical constant, the voltage required for forming a periodic inversion structure, and the electrooptical constant, are sensitive to the crystal composition ratio, and accordingly, in order to obtain maximum properties, the molar fraction of $Li_2O/(Nb_2O_5+Li_2O)$ or $Li_2O/(Ta_2O_5+Li_2O)$ of the crystal to be extremely close to 0.500.

For example, the continuous supply method has such a characteristic that the composition can be excellently controlled from the initiation until the completion of the growing, however, the determination of the composition ratio of the melt at the initiation of the growing is very important, and if the initial setting is different from the desired composition of the melt, the nonlinear optical constant $d_{33}$ or the inversion voltage required for the entire grown crystal is not satisfied. To prevent such, it is possible to correct the deviation by pulling up a small crystal before the growing, confirming the composition ratio of the melt from the composition ratio of the crystal, and adding insufficient component. However, it takes at least several days to grow the small crystal and confirm its composition ratio, whereby the productivity will significantly decrease. Further, although the continuous supply method is an extremely effective method for composition control, a slight amount of the material may evaporate from the surface of the melt kept to be at a high temperature, in the case where the growing time is so long as a level of from several days to a week. The change of the crystal composition with time due to the evaporation, can not be ignored in the case where it is required to grow a crystal of the stoichiometric composition wherein the composition is controlled to be completely homogeneous. It is extremely difficult to grow a crystal having the same characteristics with a high yield, due to this deviation of the crystal composition, and accordingly, the technique to grow a LN or LT single crystal of the completely stoichiometric composition and having no defect, from a melt having a high Li concentration, has not been put to practical use industrially.

Further, it is extremely difficult to completely form a polarization inversion width ratio of 1:1 with a high reproducibility, with the LN or LT crystal of the congruent melting composition. Namely, by voltage applying method, a periodic electrode is provided on one side of the LN or NT single crystal of the congruent melting composition of z-cut, and a uniform electrode is provided on the opposite side, and pulse voltage is applied through these electrodes, for polarization inversion at the part directly under the periodic electrode, toward the z-axis direction. However, the inversion polarization width and the electrode width are not always the same, and the preparation error is significant. Further, there are such problems that the polarization inversion widths are different between both sides of the z-cut crystal or the inversion may be broken during the formation of the polarization inversion toward the z-axis direction on the opposite side, whereby an ideal polarization inversion width range has not been obtained.

The polarization inversion width required for phase matching is about 3 μm for a use for shorter wavelength ranging from the visible region to the ultraviolet region, and an element for shorter wavelength is more difficult to prepare as compared with an element for longer wavelength. However, even with respect to a QPM element for longer wavelength, which can be relatively easily produced, an ideal element has not been achieved yet. One reason is a high applied voltage required for the polarization inversion of the LN or LT single crystal of the congruent melting composition (hereinafter referred to simply as polarization inversion voltage). The polarization inversion voltage is so high as at least 21 kV/mm, and this high inversion voltage makes it difficult to form a complete polarization inversion in a case where the thickness of the substrate is at least 0.5 mm, and no polarization having a good accuracy, capable of realizing an element, has not been produced if the thickness is at least 1.0 mm, although a polarization inversion grating may be formed on the entire substrate when the thickness is less than 0.5 mm. Further, even if the thickness of the substrate is less than 0.5 mm, a polarization inversion period of several μm, for shorter wavelength, has not been realized. Particularly in the case of a LN crystal of the congruent melting composition having at least 5 mol % of MgO added thereto, since the internal electric field is high, the hysteresis curve (P-E curve) of the ferroelectric has poor symmetry, and further, since the rising of the P-E curve is gentle and not steep near the anti-electric field, the inversion of spontaneous polarization may be poorly controlled when electric field in the direction opposite to the spontaneous polarization is applied thereto from the outside. Further, in the case of the LN crystal of the congruent melting composition having at least 5 mol % of MgO added thereto, the electric resistance will decrease by at least about 3 to 4 orders of magnitude, as compared with a case where no MgO is added, and accordingly, it will be difficult to subtly control the applying voltage, and it will be more difficult to make the polarization inversion width ratio to be 1:1. It is said that this problem may be overcome by employing corona discharge method for polarization inversion, however, the problem in the thickness of the sample for the polarization inversion has still been unsolved. Likewise, in the case of a LT crystal of the congruent melting composition having MgO added thereto, since the internal electric field is high, the P-E curve of the ferroelectric has poor symmetry, and further, since the rising of the P-E curve is gentle and not steep near the anti-electric field, the inversion of spontaneous polarization may be poorly controlled when electric field in the direction opposite to the spontaneous polarization is applied thereto from the outside. Further, in the case of the LT crystal of the congruent melting composition having MgO added thereto, the electric resistance will decrease as compared with a case where no MgO is added, and accordingly, it will be difficult to subtly control the applying voltage, and it will be more difficult to make the polarization inversion width ratio to be 1:1.

With respect to an electrooptical light modulator utilizing the electrooptical effect of a ferroelectric single crystal, an optical element having a polarization inversion structure of a lens or a prism formed on the LN or LT single crystal and polarizing laser light transmitted therethrough by utilizing the electrooptical effect, and a cylindrical lens, a beam scanner and a switch, it is important to prepare a small element having a high efficiency, to realize a new optical element. Also with respect to such an element utilizing the electrooptical effect, downsizing and obtaining high efficiency greatly depend on the characteristics of the material to be used, although they depend also on accuracy in preparation of the element structure. For example, performances of an optical element utilizing the electrooptical effect of the LN or LT single crystal having an inversion of the refractive index formed by the polarization inversion structure, are determined by the design of the polarization inversion structure of a lens or a prism, accuracy of the process for preparing the polarization inversion structure, and the electrooptical constant which the material has. With respect to the conventional LN or LT crystal of the congruent melting composition, it has been difficult to control the polarization inversion structure, since a high applied voltage is required for polarization inversion. Further, the electrooptical constant is a characteristic which the material essential has, and is considered to be difficult to improve in the same crystal. Further, the optical damage may be a big problem depending on the wavelength or the intensity of the light to be used, and in such a case, a crystal having at least 5 mol % of MgO added to the LN single crystal of the congruent melting composition, was expected to be excellent in optical damage resistance. However, such a crystal has a problem in material characteristics that the inversion of the spontaneous polarization is poorly controlled in the same manner as the preparation of the QPM element, whereby preparation of a polarization inversion structure of a lens or a prism having a good accuracy has not been realized. Further, although the LT single crystal of the congruent melting composition is believed to have a higher optical damage resistance than the LN single crystal, the optical damage may be a big problem depending upon the wavelength or the intensity of the light to be used. Even a crystal having at least 5 mol % of MgO added to the LT crystal of the congruent melting composition has insufficient optical damage resistance, and due to problems in material characteristics that the inversion of the spontaneous polarization will be poorly controlled in the same manner as the preparation of the QPM element, preparation of a polarization inversion structure of a lens or a prism having a good accuracy has not been realized.

SUMMARY OF THE INVENTION

The present inventors have conducted extensive studied to accomplish the above objects, and as a result, they have found the following. Namely, by adding to a melt at least one element selected from the group consisting of Mg, Zn, Sc and In, having substantially no absorption at the visible light region, in a total amount of from 0.1 to 3 mol % based on the total amount of the at least one element, Nb and Li, or the total amount of the at least one element, Ta and Li, a small polarization inversion voltage can be obtained without decreasing the nonlinear optical constant $d_{33}$ and the electrooptical characteristic $r_{33}$, the defects of Li can be compensated by said third element, and even with a single crystal of lithium niobate or tantalate having a certain level of nonstoichiometric defects, although having a composition in the vicinity of the stoichiometric composition, the same nonlinear optical constant, applied voltage required for preparing the periodic polarization structure, and electrooptical constant, as those of the perfect LN or LT single crystal having a molar fraction of $Li_2O/(Nb_2O_5+Li_2O)$ or $Li_2O/(Ta_2O_5+Li_2O)$ of 0.500, can be obtained; and further, this means is effective for a wide range of single crystals having a molar fraction of $Li_2O/(Nb_2O_5+Li_2O)$ or $Li_2O/(Ta_2O_5+Li_2O)$ of at least 0.490 and less than 0.500, and the present invention has been accomplished on the basis of these discoveries.

Czochralski method (CZ method) has been conventionally known as a method for growing a large single crystal of high quality. The CZ method is a method for producing a single crystal suitable for growing a large crystal of the congruent melting composition, wherein a seed crystal is contacted with a melt filled in a crucible, and the seed crystal is pulled upward while being rotated, for growing a single crystal below the seed crystal.

This method is now most commonly used industrially, for both oxide single crystal and semiconductor single crystal. However, when it is attempted to grow a longitudinal single crystal having a larger diameter at a low cost, the capacity of the crucible is limited, and accordingly, continuous pulling method of supplying a material into the crucible while pulling the single crystal up, has been devised, and various methods have been tried, including double crucible method.

This method is to produce a single crystal by employing such a structure that in the usual crucible, another crucible or cylinder having an opening for melt flow and having a small inner diameter, is arranged, wherein the outer crucible is for supplying a material, and the single crystal is pulled up from the inner crucible and grown (JP-A-57-183392, JP-A-47-10355).

For growing a semiconductor crystal such as Si or GaAs, a method of introducing a material in an amount corresponding to the degree of growth to the outer crucible when the single crystal being pulled up has grown to have a predetermined diameter, and its practical use is being considered. However, this is mainly for uniform addition of a dopant to obtain a longitudinal single crystal or to homogenize the material characteristics in the production of the semiconductor single crystal (JP-A-63-95195, Japanese Patent No. 2729243).

Also in the case of an oxide single crystal, a method for producing a crystal by means of a double crucible, similar to the production of a semiconductor single crystal, has been proposed. The method is mainly for growing a crystal of a composition different from the composition of the melt, which is difficult to grow by the CZ method on principle, and the method is expected to be excellent and being developed.

For example, a method is known for producing a crystal at a constant rate with the temperature and the composition of the material melt kept to be constant, by supplying material pellets between the outer crucible and the inner crucible, in order to overcome the low growth efficiency or variation of the crystal growth condition due to decrease in temperature and height of the melt required for the progress of the crystal growth, which have been problems in TSSG method which is one of solution pulling methods (JP-A-4-270191).

FIG. 4 is a schematic diagram illustrating a double crucible method of material supply type, which has been developed to make the pulling rate of a lifting and lowering head 7 by a crystal pulling shaft 6 and the falling rate of a melt 9 to be constant, by supplying material pellets 10 between an outer crucible 2 and an inner crucible 3 at a constant rate. In this method, several problems in the TSSG method have been overcome. In this method, a heater 4 is arranged at the outside of a double crucible 1, and the inner crucible 3 is provided with large holes 12, and a single crystal 11 is grown from a seed crystal 8 while dropping the material pellets 10 to the material melt 9 between the outer crucible 2 and the inner crucible 3 through a supply tube 5.

Further, a method for producing an oxide single crystal of high quality, by employing a noble metal crucible having a double structure, which functions also as a container generating heat by high frequency induction heating, to minimize the change of the temperature of the melt due to heating by the high frequency induction of the crucible, has been known, although the material is not supplied in this method, in order to overcome the problem of the change of the temperature during the growing of a crystal of the congruent melting composition wherein the compositions of the melt and the grown crystal are the same (JP-A-4-74790).

FIG. 5 is a schematic diagram illustrating the above method employing a double crucible made of a noble metal. A melt 15 of an oxide is put in an outer crucible 13, and in the outer crucible 13, a cylinder 14 having a smaller diameter than the inner diameter of the outer crucible 13 is arranged, however, this is to stabilize the temperature of the melt, and a means of supplying a material for growing a longitudinal crystal is not arranged. Further, in order to grow a crystal as long as possible, the shape of the outer crucible 13 is such that its height is substantially the same as or higher than its diameter.

Further, in order to grow a $LiNbO_3$ single crystal of the stoichiometric composition having a molar fraction of $Li_2O/(Nb_2O_5+Li_2O)$ of 0.50, which can not be grown by the conventional CZ method, a method for producing a single crystal employing a double crucible, wherein a melt of a composition having an excessive Li component with a molar fraction of $Li_2O/(Nb_2O_5+Li_2O)$ of from 0.58 to 0.60 is preliminarily prepared in the inner crucible, a crystal of the stoichiometric composition is deposited therefrom, and an apparatus for continuously supplying a material powder prepared to have the same stoichiometric composition as the deposited crystal at the same time as the deposition of the crystal, is arranged, has been developed, and $LiNbO_3$ single crystals having a homogeneous composition over the entire crystal, and having a composition in the vicinity of the stoichiometric composition, have been grown (K. Kitamura et al., Journal of Crystal Growth vol. 116, 1992, pages 327–332; Oyo Butsuri (Applied Physics) vol. 65, No. 9, 1996, pages 931–935).

FIGS. 6 and 7 are schematic diagram illustrating the above method. The change of the growth weight per unit time is measured by a load cell (52 in FIG. 6 or 27 in FIG. 7) for detecting the weight of the crystal, and a material powder in an amount corresponding to this change is supplied between an outer crucible (56, 19) and an inner crucible (55, 20) through a material supply tube (53, 22) arranged in such a manner that the angle to the vertical is from 65 to 76°. In either apparatus, the material is supplied automatically, and the supply amount of the material in a container for preserving the material is controlled by a piezo oscillator 54 in FIG. 6, or by a screw in FIG. 7.

Here, the diameter of the crystal to be grown is from about 1 to about 1.5 inches, and the shapes of the inner crucible and the outer crucible to be used for growing are such that the ratio of the diameter of the inner crucible to the diameter of the outer crucible is 0.5. Further, the crucible is not rotated in the apparatus shown in FIG. 6, and in the apparatus shown in FIG. 7, the crucible is extremely slowly rotated at a low rate of from about 0.1 to about 0.3 rpm in the direction opposite to the rotation of the crystal, for growing crystal, with a purpose of homogenizing the supplied material and the melt.

In the above method for producing an oxide single crystal which has conventionally been known, what is significantly different from the method for producing a semiconductor single crystal, is that a noble metal crucible which will not react with the melt is used for growing the crystal, and the weight of the material to be automatically supplied to the outer crucible has to be more precisely controlled since the amount of the crystal growth per unit time is small.

Accordingly, it is one of big problems to be overcome from industrial viewpoint to develop technique for growing a large and longitudinal crystal by using a crucible as small as possible, and to develop a growing technique by which the crucible can be used many times, since the noble metal crucible is likely to be deformed and it is extremely expensive.

As mentioned above, in the case where a crystal is grown without supplying the material, as shown in FIG. 5, there is a limit to making the crystal longitudinal. To grow a longitudinal crystal, it is necessary to prepare a crucible having a large diameter and to melt a large amount of the material. However, the crystal can not be made longer than the amount corresponding to the weight of the material preliminarily charged, and the noble metal crucible is extremely expensive, and accordingly the crystal will be rather costly, and the merit of the growing at a low cost by making the crystal longitudinal will be offset.

Further, in this case, the height of the surface of the melt decreases along with the progress of the growth, and thermal growth environment will gradually change, whereby the crystal growth interface may change, and accordingly, deterioration in quality is caused such as introduction of unfavorable crystal defects or distortion of the crystal. Such a problem can not be overcome even when a noble metal crucible with a double structure is employed, in the case where the material is not supplied in an amount corresponding to the weight of the grown crystal.

Accordingly, as shown in FIGS. 6 and 7, the double crucible method with material supply has been developed as a method to overcome the above problems, however, several problems has been found. For example, in this method, by employing a double crucible structure, the change in the temperature of the melt in the inner crucible can be made small, whereby defects such as growth striations observed in the obtained single crystal can be decreased, such being advantageous; on the other hand, the temperature gradient of the melt in the inner crucible in the diameter direction will be extremely gentle, and the shape of the crystal growth interface will be significantly different from one obtained by using a conventional single crucible, whereby it will be difficult to control the crystal growth interface and the crystal diameter which are important to grow a crystal of high quality.

FIG. 7 illustrates an example wherein the crystal growth interface is convex to the melt, and the crystal diameter can be well controlled. However, the growth interface is closely related with the relation between the size of the growing crystal and the size of the inner crucible, the thermal conductivity of the crystal, and the presence or absence of a dopant, and accordingly, in the case where the temperature gradient of the melt in the inner crucible in the diameter direction is extremely gentle, some device is required to control the shape of the crystal growth interface to be flat or convex to the melt. However, even if the conventional rotation of the crucible is carried out with a purpose of homogenizing the melt, no effect of forcibly controlling the growth interface can be obtained with an extremely slow rotation in the opposite direction to the rotation of the crystal at a low rate of from about 0.1 to about 0.3 ppm.

Further, with respect to the known methods for producing a single crystal by using a double crucible, as shown in FIGS. 4 and 5, the shape of the outer crucible is such that its diameter is substantially the same as the height of the crucible, and in the outer crucible, a crucible or a cylinder having a diameter and a height smaller than the outer crucible, having a hole, and called an inner crucible, is arranged.

It has been known that the proportion of the diameter of a crystal of high quality capable of being grown is usually about half relative to the diameter of the crucible. Accordingly, when a simple comparison is made with respect to the size of the crucible required for growing a crystal of the same size, the amount of a noble metal which is expensive, will be large in the case where a double crucible is used as compared with the case where only single crucible is used. Further, deformation of the noble metal crucible is significant after growing the crystal, according to the heating method or the shape of the double crucible, whereby the expensive noble metal crucible has to be repaired after every use of from several times to several tens times. Accordingly, if a double crucible having a larger size is used, the noble metal is far expensive as compared with the material, whereby the single crystal will be rather costly.

Further, there are several problems with respect to the methods of supplying the material in the method for producing a single crystal by using a double crucible, which have been conventionally reported. In the case where the material is supplied in the form of pellets as shown in FIG. 4, the weight of the pellets is heavy as compared with the weight of the powder. Accordingly, the supply of the material through the supply tube, i.e. falling of the material, is carried out relatively smoothly, and the material will not clog up the supply tube. However, the pellets will be supplied intermittently as compared with the continuous supply of the powder material, whereby the change in the temperature along with the material supply tends to be significant.

On the contrary, when the powder material is supplied by the method shown in FIG. 6 or 7, although there will be few problems in the intermittent temperature change along with the material supply, the material is likely to deposit on the supply tube during the supply, whereby the material tends to clog up the supply tube, depending on the size or the calcination condition of the powder. The supply tube is arranged in the growing furnace and is not transparent, it is thereby difficult to observe if the material clogs up the tube during the growing, and the clogging may not be noticed until the growing has completed.

Further, the crystal which is more difficult to grow from a melt by pulling, usually requires a lower growth rate and a smaller crystal diameter. In such a case where the amount of the crystal growth is small per unit time, it is necessary to supply a powder material having a correspondingly small particle size in a small amount. However, in such a case, the powder material may not fall into the crucible, but be flown up. Further, as shown in FIGS. 4, 5 and 6, in a case where the crucible is not rotated, if the material is always supplied to a certain specific portion between the outer crucible and the inner crucible, the crystal may precipitates from said portion, or the grown crystal may have non-uniformity in quality since no adequate melting and homogenization of the material may be carried out.

The method for producing a single crystal by using a double crucible, which has conventionally been used for growing an oxide single crystal, has some advantages to overcome the problems of the conventional Czochralski method, in principle. However, a means of supplying a material in an amount corresponding to the weight of the grown crystal, is not provided, or even if said means is provided, a method for industrially producing an oxide single crystal of high quality stably at a low cost, has not been achieved.

The present inventors have conducted extensive studies to achieve the above objects, and as a result, they have found the following. Namely, in the process for producing an oxide single crystal by rotation pulling by means of a double crucible made of a noble metal, by precisely controlling the method of arranging the material supply tube and the method of supplying the material, the method of preparing the material powder, the shape of the double crucible and the relation between the inner crucible and the outer crucible, rotation of the crucible and the like, it becomes possible to grow a crystal of high quality having a large diameter and being longitudinal, stably at a low cost, with respect to a crystal of the congruent melting composition or another nonstoichiometric composition, which has been considered to be difficult to grow, and the present invention has been accomplished on the basis of these discoveries.

Namely, the present invention provides a process for producing an oxide single crystal by rotation pulling by means of a double crucible made of a noble metal, consisting of an outer crucible made of a noble metal, and a cylindrical inner crucible for intersecting the surface of a melt in the outer crucible and connecting the melt at the bottom of the melt, which process comprises pulling a single crystal from the inner crucible while directly measuring the weight of the growing crystal for growing, simultaneously supplying a gas into a closed container, supplying a powder material preserved in the closed container between the outer crucible and the inner crucible through a supply tube in the same amount by weight as the crystal growth, and growing the crystal while rotating the double crucible.

DETAILED DESCRIPTION OF THE PREFERRED EMBODIMENTS

Figure 1:
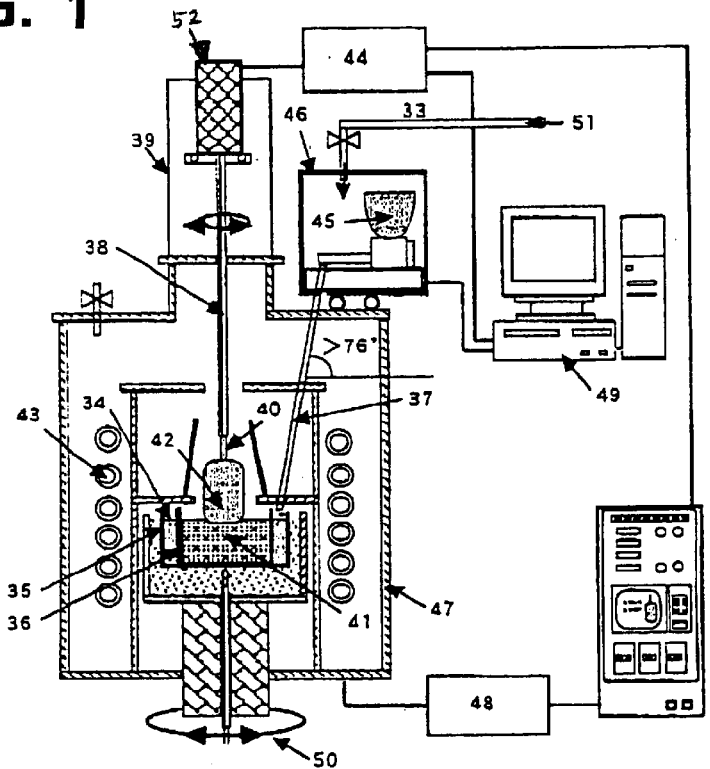
FIG. 1 is a schematic diagram illustrating the apparatus for producing an oxide single crystal of the present invention.

The effect of Mg addition to $d_{33}$ can be explained as follows. The nonlinear optical characteristic of the LN or LT crystal may be generated by the bonding of the Li element and the O element, and accordingly, non-linearity will decrease along with the increase of the Li defect, and the LN or LT crystal having a molar fraction of $Li_2O/(Nb_2O_5+Li_2O)$ or $Li_2O/(Ta_2O_5+Li_2O)$ of 0.500 shows maximum non-linearity since the crystal contains no Li defect. In the case of a crystal which is not of the stoichiometric composition, excessive Nb or Ta element will come into the Li defect portion, however, the bonding of the Nb or Ta element with the O element generates little non-linearity, whereby the non-linearity will be small as a whole. On the contrary, in the case where Mg is added, Mg will come into the Li defect portion, thus generating non-linearity by bonding of the Mg element with the O element. The non-linearity by bonding of the Mg element and the O element is about the same as the non-linearity by bonding of the Li element and the O element, and further, even if the molar fraction of the crystal of $Li_2O/(Nb_2O_5+Li_2O)$ or $Li_2O/(Ta_2O_5+Li_2O)$ changes due to a change in the composition ratio of the melt for growing, the Mg element present in the melt compensate the Li defect. Accordingly, the maximum nonlinear optical characteristics may be kept even if there is some deviation in the molar fraction of the crystal of $Li_2O/$ $(Nb_2O_5+Li_2O)$ or $Li_2O/$ $(Ta_2O_5+Li_2O)$ Further, the effect of Mg addition to the polarization inversion voltage can be explained as follows. The significant decrease of the polarization inversion voltage of the crystal of the stoichiometric composition as compared with the conventional LN or LT single crystal of the congruent melting composition, can be explainable by that the number of the Li defects for pinning the polarization inversion becomes small. On the other hand, it is considered that in the case of Mg addition, the minimum voltage is obtained despite of the deviation of the molar fraction of $Li_2O/(Nb_2O_5+Li_2O)$ or $Li_2O/(Ta_2O_5+Li_2O)$ within a range of at least 0.490 and less than 0.500, since the pinning effect in a state where the Li site is substituted by Mg, is small as compared with the effect by the Li defects. However, the pinning effect in the state where the Li site is substituted by Mg, is high as compared with the effect at the portion having no defect, and accordingly, such an effect will be significantly obtained only in a small range of the crystal having a molar fraction of $Li_2O/(Nb_2O_5+Li_2O)$ or $Li_2O/(Ta_2O_5+Li_2O)$ of at least 0.490 and less than 0.500. For example, in the case where Mg is added to the LN crystal of the congruent melting composition, although the polarization inversion voltage will decrease, the electric resistance will decrease by at least about four orders of magnitude as compared with the case where no Mg is added, and accordingly the polarization inversion may not be carried out by a conventional voltage applying method, and a special method of corona discharge method is required. When the molar fraction of $Li_2O/(Nb_2O_5+Li_2O)$ is within a range of at least 0.490 and less than 0.500, the amount of Mg, Zn, Sc and In required is so small as from 0.1 to 3.0 mol % based on the total amount of said element, Nb and Li, whereby there will be no sudden drop in electrical resistance. Likewise, in a case where Mg is added to the LT crystal of the congruent melting composition, although the polarization inversion voltage will decrease, the electric resistance will decrease as compared with the case where no Mg is added. However, when the molar fraction of $Li_2O/(Ta_2O_5+Li_2O)$ is within a range of at least 0.490 and less than 0.500, the amount of Mg, Zn, Sc and In required is so small as from 0.1 to 3.0 mol % based on the total amount of said element, Ta and Li, whereby there will be no sudden drop in electrical resistance.

Further, the effect of Mg addition to $r_{33}$ is considered to be substantially the same as the effect to $d_{33}$, although it is not explained at present. Namely, if the bonding of the Li element and the O element in the LN or LT crystal is the main factor for developing the electrooptical characteristics, the electrooptical constant will decrease along with the increase of the Li defects, and the LN or LT crystal having a molar fraction of $Li_2O/(Nb_2O_5+Li_2O)$ or $Li_2O/(Ta_2O_5+Li_2O)$ of 0.500, having no Li defect contained, is expected to show the maximum electrooptical constant. In the case of a crystal which is not of the stoichiometric composition, excessive Nb or Ta element comes into the Li defect portion, however, the bonding of the Nb or Ta element and the O element develops few electrooptical characteristics, and accordingly, the electrooptical constant tends to be small as a whole. On the contrary, in the case of Mg addition, Mg comes into the Li defect portion, thus developing the electrooptical characteristic by bonding of the Mg element and the O element. It is explained that if the electrooptical characteristic by bonding of the Mg element and the O element is about the same as the electrooptical characteristic by bonding of the Li element and the O element, the Mg element present in the melt compensates the Li defect, even if the molar fraction of the crystal of $Li_2O/(Nb_2O_5+Li_2O)$ or $Li_2O/(Ta_2O_5+Li_2O)$ further changes due to the change of the composition ratio of the melt for growing, and accordingly, the maximum electrooptical constant may be kept even if there is some deviation in the molar fraction of the crystal of $Li_2O/(Nb_2O_5+Li_2O)$ or $Li_2O/(Ta_2O_5+Li_2O)$.

In the present invention, in the continuous supply method, for example, a single crystal having the same nonlinear optical constant, voltage for forming the polarization structure and electrooptical constant as those of the LN or LT single crystal having a molar fraction of $Li_2O/(Nb_2O_5+Li_2O)$ or $Li_2O/(Ta_2O_5+Li_2O)$ of 0.500, can be grown, by adding at least one of Mg, Zn, Sc and In, in an amount of at least 0.1 mol, even if the setting of the composition ratio of the melt at the initiation of the growing departs from the desired composition of the melt, and as a result, the yield of the crystal growth can be significantly improved.

Further, there will be heterogeneity in the molar fraction of $Li_2O/(Nb_2O_5+Li_2O)$ or $Li_2O/(Ta_2O_5+Li_2O)$ in the crystal, due to change in the composition ratio of the melt generated during the growing resulting from evaporation of the melt or the heterogeneity in the composition ratio of the melt for growing, or due to the change in the temperature of the melt at the interface between the crystal and the melt resulting from the temperature distribution in the crucible. However, according to the present invention, the nonlinear optical constant, the voltage for forming the polarization structure and the electrooptical constant are no longer depend on the molar fraction of $Li_2O/(Nb_2O_5+Li_2O)$ or $Li_2O/(Ta_2O_5+Li_2O)$, whereby there will be no heterogeneity in such characteristics, and accordingly, the growth condition for stably producing the LN or LT crystal having a high homogeneity and excellent performances will be extremely moderate.

Here, the molar fraction of $Li_2O/(Nb_2O_5+Li_2O)$ or $Li_2O/(Ta_2O_5+Li_2O)$ is adjusted to be at least 0.490 and less than 0.500, since the decrease of the polarization inversion voltage may be inadequate in the crystal of a composition having the molar fraction of less than 0.490. Further, in the crystal of a composition having a molar fraction of $Li_2O/(Nb_2O_5+Li_2O)$ or $Li_2O/(Ta_2O_5+Li_2O)$ of at least 0.490 and less than 0.500, little internal electric field will be observed, the hysteresis curve (P-E curve) of the ferroelectric will have excellent symmetry, and the rising of the P-E curve will be good near the anti-electric field, whereby the inversion of the spontaneous polarization can be extremely easily controlled when the electric field in the direction opposite to the spontaneous polarization is applied from the outside. Further, with respect to the crystal of a composition having a molar fraction of $Li_2O/(Nb_2O_5+Li_2O)$ or $Li_2O/(Ta_2O_5+Li_2O)$ of at least 0.490 and less than 0.500, the concentration of added Mg is required to be less than 3 mol %, whereby sudden drop of the electric resistance can prevented which may be observed in the crystal having Mg added in an amount of 5.0 mol % to the crystal of the congruent melting composition, and further, a QPM element having an extremely high efficiency with a polarization inversion width range of substantially 1:1, can be produced.

With respect to an optical element for changing the wavelength of laser light incoming into the single crystal by the above constitution, a LN single crystal having a nonlinear optical constant $d_{33}$ of at least 26 pm/V and an applied voltage required for polarization inversion at room temperature of less than 3.7 kV/mm, and a LT single crystal having a nonlinear optical constant $d_{33}$ of at least 15 pm/V and an applied voltage required for polarization inversion at room temperature of less than 3.5 kV/mm, can be produced. A QPM element having a thickness in z-axis direction of at least 1.0 mm and a period of the polarization inversion of at most 30 µm is realized by the LN or LT crystal of the present invention for the first time, and a QPM element having a period of the polarization inversion of at most 5 µm is also realized by the present invention for the first time.

Further, with respect to an optical element for controlling the laser light incoming into the single crystal by utilizing the electrooptical effect of the single crystal by the above constitution, a single crystal of lithium niobate having an electrooptical constant $r_{33}$ of at least 36 pm/V at a wavelength of 0.633 µm, and a single crystal of lithium tantalate having an electrooptical constant $r_{33}$ of at least 34 pm/V at a wavelength of 0.633 µm, can be produced. An optical element for stably carry out polarization, focusing and switching of light with a high efficiency, by utilizing a significant change in refractive index of such a structure that the ferroelectric polarization of the single crystal is inversed, can be realized by the LN or LT crystal of the present invention for the first time.

With respect to the process for producing an oxide single crystal of the present invention, the powder material is supplied from a closed container for preserving material into the double crucible through a supply tube made of ceramic or a noble metal and arranged in such a manner that the angle to the vertical is larger than 76°, a gas is flowed from the closed container through the supply tube at a rate of from 50 to 500 cc/min, to smoothly supply the material without clogging, by using a powder material which has crystallization calcination treatment at a high temperature preliminarily applied thereto to obtain coarse particles, and which is classified into a size within a range of from 50 to 500 µm. The smooth supply of the material is likely to be influenced by a subtle adjustment angle of the material supply tube, and accordingly, if the angle to the vertical is smaller than 76°, the material can not be smoothly supplied even if a gas is supplied to the closed container as in the present invention.

The double crucible is arranged so that the height of the inner crucible is equal to or higher than the height of the outer crucible, and the melt is deposited and solidified on the wall of the inner crucible during a step of cooling the melt after the pulling of the crystal has been completed, whereby deformation of the outer crucible made of a noble metal can be minimized.

The double crucible is rotated at a rate of from 1 to 20 rpm so as to forcibly control the shape of the crystal growth interface simultaneously with the homogenization of the melt and the powder material supplied.

The production process of the present invention is particularly suitable for producing an oxide single crystal of $LiTaO_3$ or $LiNbO_3$ having a diameter of at least 2 inches.

The present invention further provides an apparatus for producing an oxide single crystal by rotation pulling by means of a noble metal crucible with a continuous supply of a powder material, which comprises an outer crucible made of an noble metal and a cylindrical inner crucible made of a noble metal for intersecting the surface of the melt in the outer crucible and connecting the melt at the bottom of the melt, wherein the outer crucible has such a shape that the ratio of the height to the diameter is within a range of from 0.3 to 1, and the shapes of the inner crucible and the outer crucible are such that the ratio of the diameter of the inner crucible to the diameter of the outer crucible is from 0.55 to 0.9.

The present invention further provides the above apparatus for producing an oxide single crystal, which is provided with a weight measuring sensor attached to the closed container, and a powder material supply system having a means for supplying a gas to the closed container.

Further, the apparatus for producing an oxide single crystal of the present invention is preferably provided with a high frequency heating device as a means of heating the material.

According to the present invention, growing of a crystal of high quality having a large diameter and being longitudinal at a low cost, which has conventionally been an object, can be achieved by significantly improving the condition or the shape of the material to be supplied, the method for smoothly supplying the material, and the shape and the rotation method of the crucible, which have been conventionally problematic, and by homogenizing the melt and the material supplied and optimizing the growth interface.

Figure 2:
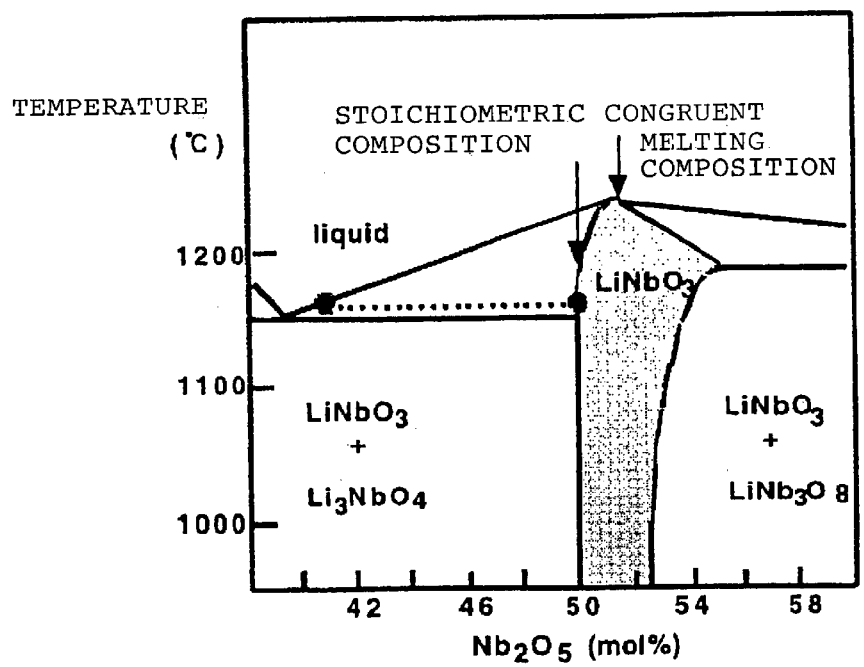
FIG. 2 is a diagram illustrating the phase diagram of Li and Nb.

The principle of the double crucible method for growing a LN crystal of the stoichiometric composition will be briefly explained with reference to FIG. 2 illustrating the phase diagram of LN. As shown in the phase diagram, the congruent melting composition of the LN single crystal is such that the molar fraction of $Li_2O/(Nb_2O_5+Li_2O)$ is 0.485, and accordingly, the LN single crystal obtained by conventional pulling method from a melt of the congruent melting composition will have an excessive Nb component. However, when a crystal is grown from a melt of a composition having a significantly excessive Li component (e.g. molar fraction of $Li_2O/(Nb_2O_5+Li_2O)$ of from 0.56 to 0.60), a single crystal of a composition in the vicinity of the stoichiometric composition (molar fraction of $Li_2O/(Nb_2O_5+Li_2O)$ of 0.50), i.e. a single crystal having a non-stoichiometric defect concentration of as low as possible, can be obtained.

However, if the composition of the growing crystal and the composition of the melt are different, the compositions will be more different from each other along with the growth by the conventional pulling method, whereby it will be difficult to grow. Accordingly, to precisely control the density and the structure of the nonstoichiometric defects, the apparatus for growing a single crystal by the double crucible method of the present invention, as shown in FIG. 1, will be necessary.

In the process for producing a single crystal by rotation pulling of the present invention, a double crucible made of a noble metal is employed, the single crystal is pulled up from the crucible while directly measuring the weight of the growing crystal by a balance or a load cell, a gas is supplied to a closed container equipped with a weight measuring sensor provided at the upper part of a growing furnace, and a powder material preserved in the closed container is continuously supplied in the same amount as the crystal growth between the outer crucible and the inner crucible from the supply tube. A container having the powder material put therein and a screw apparatus for discharging the powder material, are provided on the weight measuring sensor provided in the closed container, such as a balance, so as to measure the amount of decrease of the powder material, so that the powder material can be supplied in the same amount as the crystal growth by the material supply system controlled by a computer.

The powder material is discharged from the closed container for preserving material, provided on the upper part of the furnace, by screw method, through the supply tube made of ceramics or a noble metal arranged in such a manner that the angle to the vertical is larger than 76°. By flowing a gas to the closed container at a rate of from 50 to 500 cc/min, the gas is flowed through the supply tube, whereby a continuous and smooth supply of the material without clogging of the supply tube with the powder material, which has conventionally been an object to overcome, can be carried out for the first time. The closed container is not necessarily completely closed so long as the leakage is not significant. Further, as the gas, preferred is a gas of the same atmosphere as the growing atmosphere, and a pure nitrogen gas is preferred as an inert gas in the case of an iridium crucible, and a mixed gas of oxygen and nitrogen is preferred in the case of a platinum crucible.

The material powder is preliminarily subjected to crystallization calcination treatment at a high temperature to form coarse particles, and classified into a size within a range of from 50 to 500 $\mu$m, whereby a smoother and well-controlled supply of the material can be carried out.

Further, it is essential to use a crucible having a larger diameter than the diameter of the crystal in order to grow a crystal having a predetermined diameter. Conventionally used is an outer crucible made of a noble metal having such a shape that the height and the diameter are substantially the same. However, in the present invention, a crystal of high quality can be grown even when the shape of the noble metal outer crucible is such that the ratio of the height to the diameter is smaller than 1 and larger than 0.3. This double crucible has such a structure that the melt filled in the crucible and melted is intercepted at the surface of the melt by an inner crucible provided in the outer crucible, the melt in the outer crucible will not flow into the inner crucible at the upper part, and the melts in the inner crucible and the outer crucible are connected with each other by large holes provided on the lower part of the wall of the inner crucible.

Further, the shapes of the inner crucible and the outer crucible are not required to have such a ratio in diameter of the inner crucible to the outer crucible of 0.5, on the contrary, by adjusting the ratio in diameter of the inner crucible to the outer crucible to be within a range of from 0.55 to 0.9, an oxide single crystal having a large diameter and a longitudinal shape can be produced at a low cost with minimized amount of an expensive noble metal. Here, with respect to the shape of the outer crucible made of a noble metal, the ratio of the height to the diameter is preferably from 0.5 to 0.7 in view of homogenization of the melt and stabilization of the growing. Further, the ratio in diameter of the inner crucible to the outer crucible is not necessarily constant, but it is preferably adjusted to be within a range of from 0.55 to 0.9 according to the diameter of the crystal to be grown, and it is preferably adjusted to be close to 0.9, along with the increase in the diameter of the crystal to be grown. This is because the space between the outer crucible and the inner crucible, required for the material supply, may not be too large so long as the material supply tube can be stably arranged and the material will smoothly fall thereto. Accordingly, by adjusting the ratio in diameter of the inner crucible to the outer crucible to be in the vicinity of 0.9, along with the increase in the diameter of the crystal to be grown, a crystal having a large diameter can be grown even with an outer crucible having a small outer diameter.

Figure 4:
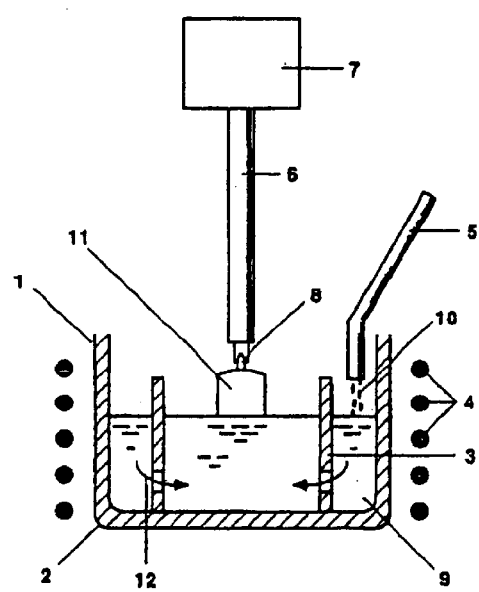
FIG. 4 is a schematic diagram illustrating an apparatus for producing a single crystal employing a double crucible with supply of material pellets, which is used in a conventional method.
Figure 5:
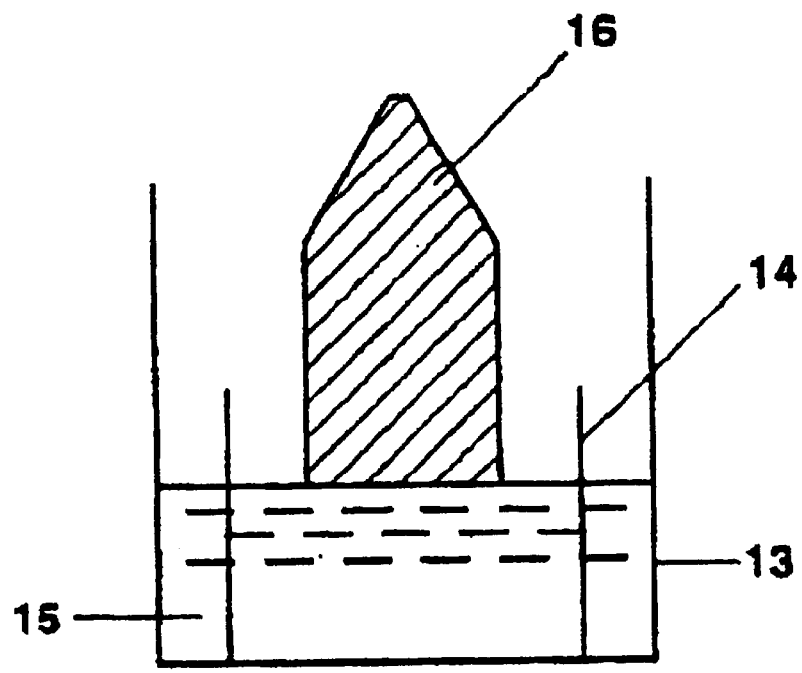
FIG. 5 is a schematic diagram illustrating an apparatus for growing a single crystal having a double crucible structure, which is used in a conventional method.
Figure 6:
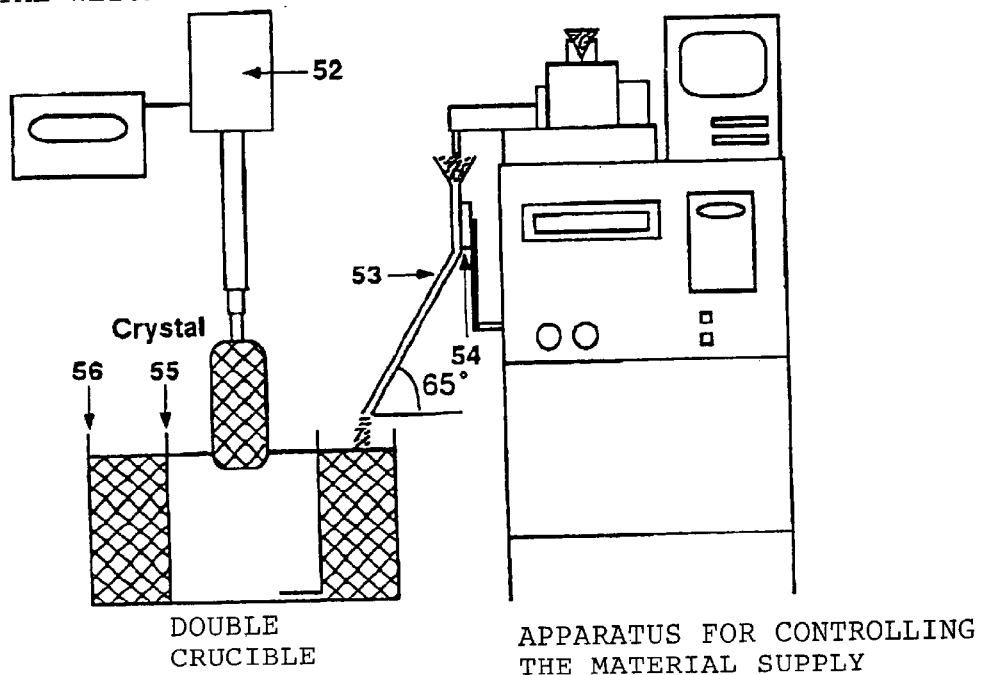
FIG. 6 is a schematic diagram illustrating an apparatus for growing a single crystal by a double crucible equipped with a means of automatically supplying material powder, which is used in a conventional method.
Figure 7:
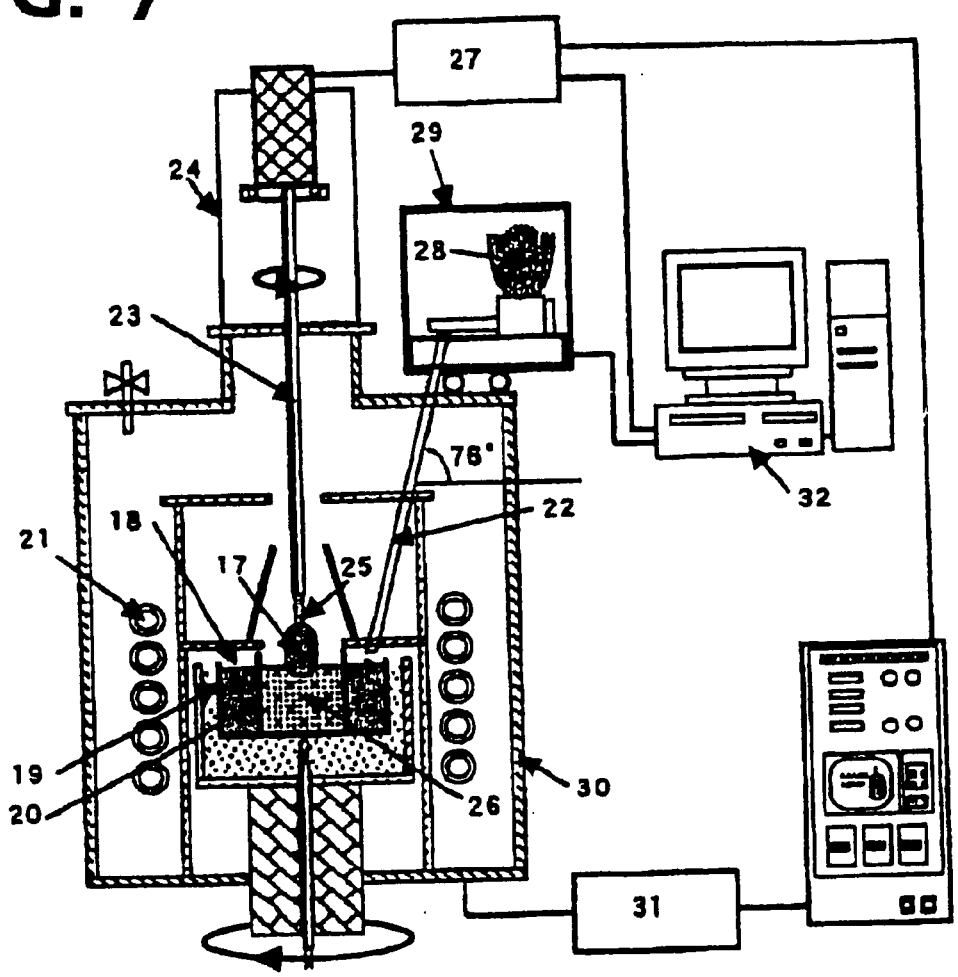
FIG. 7 is a schematic diagram illustrating an apparatus for growing a single crystal by a double crucible equipped with a means of automatically supplying material powder, and a crucible rotation mechanism at a low rate in the direction opposite to the rotation direction of the single crystal, which is used in a conventional method.

Further, with respect to a conventional double crucible shown in FIGS. 4 and 5, a noble metal crucible has such an arrangement that the height of the inner crucible is lower than the height of the outer crucible. However, in such a case, the lower part of the supply tube close to the crucible is locally overheated by the crucible as a heating area, whereby the supplied material powder may deposit on the supply tube and cause clogging, or by solidification of the melt during a step of cooling the crystal after the crystal growth, particularly the outer crucible is susceptible to stress and is likely to significantly deform, and accordingly, the crucible is hardly used for growing for several tens times.

On the other hand, in the present invention, the double crucible is arranged in such a manner that the height of the inner crucible is equal to or higher than the height of the outer crucible, whereby the hating temperature of the upper part of the inner crucible by high frequency introduction heating is lower than the outer crucible, so that the melt is deposited and solidified on the wall of the inner crucible during a step of cooling the melt after the pulling has been completed, so as to minimize the deformation of the outer crucible made of a noble metal. Accordingly, a production of an oxide single crystal by using an expensive noble metal can be carried out at a significantly low cost.

Further, the convection of the melt is forcibly controlled so that the shape of the crystal growth interface is flat or convex to the surface of the melt, simultaneously with homogenization of the melt and the powder material supplied, by rotating the noble metal double crucible, whereby the crystal of high quality having a large diameter and a longitudinal shape and having fewer defects than the crystal grown by the method for producing an oxide single crystal by the conventional double crucible method, can be produced at a low cost.

Namely, although it has been known that it is important to make the crystal growth interface to be flat or convex to the melt in order to grow a crystal of high quality having few defects, the growth interface tends to be concave in the case where the temperature gradient of the melt in the inner crucible in the diameter direction is extremely gentle when the double crucible structure is employed. However, the growth interface can be forcibly controlled to be convex by rotating the crucible.

The growth interface is closely related with the relation between the size of the crystal to be grown and the size of the inner crucible, the thermal conductivity of the crystal, and the presence or absence of a dopant, and accordingly it is required to optimize the rotation of the crucible, depending upon the material and the growth conditions. Here, the crucible is rotated with a purpose of homogenizing the melt and the powder material supplied, and besides, positively controlling the growth interface to be flat or convex, and from the viewpoint of this purpose, the crucible may be rotated in the same direction as the rotation of the crystal, or in the opposite direction, to obtain the effect.

If the crucible is rotated only with a purpose of homogenization, the crucible may be extremely slowly rotated in the direction opposite to the rotation of the crystal at a low rate of from about 0.1 to about 0.3 rpm, as conventionally known. In a case where the crystal and the crucible are rotated in the same direction at the same rate, there will be substantially no relative rotation, and the relative rotation seems to be the same as the case where either the crucible nor the crystal are rotated. However, it is confirmed that the effect of controlling the convection of the melt is obtained only when the crucible is rotated.

Here, in the case of growing the LN single crystal or the LT single crystal, the crucible may be rotated in either direction, and it may be rotated at a high rate of at least 10 rpm, and in this case, it is important to adjust the center axes of the crystal, the crucible and the rotation axis to be the same with a high accuracy. The rotation speed of the crucible is usually preferably from 1 to 20 rpm. Further, although the effect of inducing the convection may be obtained even if the rotation of the crucible is periodically inverted, it is preferred to rotate the crucible in the predetermined direction with a purpose of controlling the growth interface to be stable.

Now, the present invention will be described in detail with reference to Examples. However, it should be understood that the present invention is by no means restricted to such specific Examples.

In the present Examples, Mg was used as the above third element.

EXAMPLE 1

Commercially available high purity material powders of $Li_2O$ and $Nb_2O_5$, where mixed to prepare a material having an excessive Li component and having a ratio of $Li_2O:Nb_2O_5$ of 0.56–0.60:0.44–0.40, and a material of the stoichiometric composition of $Li_2O:Nb_2O_5$ of 0.50:0.5. The mixtures were subjected to rubber pressing under a hydrostatic pressure of 1 ton/cm, and calcination in the atmosphere of about 1,050° C. to prepare material sticks. Further, the mixed material of the stoichiometric composition to be a material for continuous supply, was calcinated in the atmosphere of about 1,150° C, pulverized and classified into a size within a range of from 50 to 500 μm. Then, to grow a single crystal by double crucible method, the material stick of the material having an excessive Li component was preliminarily filled in an inner crucible and an outer crucible, and the crucible was heated to prepare a melt having an excessive Li component. In experiments to confirm the effect of Mg addition, commercially available high purity $MgCO_3$ or MgO was preliminarily filled in the inner crucible and the outer crucible when the above material stick was filled. With respect to the weight of $MgCO_3$ or MgO to be filled, five experiments were carried out wherein the Mg concentration in the melt was 0.1, 0.2, 0.5, 1.0 or 3.0 mol % (mol % is defined by $[Mg]/([Mg]+[Li]+[Nb])\times 100$ mol %). Further, experiments were carried out wherein the Mg concentration was 0, 0.05 or 5.0 mol %, for comparison.

Here, the principle of the double crucible method for growing the LN crystal of the stoichiometric composition will be explained with reference to FIGS. 1 and 2. FIG. 2 illustrates the phase diagram of LN. As shown in the phase diagram, the LN single crystal obtained by conventional pulling method from a melt of the congruent melting composition of the LN single crystal will have excessive Nb component, however, when a crystal is grown from a melt of a composition having a significantly excessive Li component (e.g. the molar fraction of $Li_2O/(Nb_2O_5+Li_2O)$ of from 0.56 to 0.60), a single crystal of a composition in the vicinity of the stoichiometric composition with a molar fraction of $Li_2O/(Nb_2O_5+Li_2O)$ of 0.500, i.e. a single crystal having the nonstoichiometric defect concentration of as low as possible, can be obtained.

FIG. 1 illustrates an apparatus for producing an oxide single crystal used in the present invention. The double crucible had such a structure that in an outer crucible 35, a cylinder 36 (hereinafter referred to as inner crucible) having a height higher by 7.5 mm than the outer crucible was arranged, and at the bottom of the inner crucible, three large holes having an approximate quadrangular shape and a size of about 20 mm×about 30 mm, for connecting the outer crucible with the inner crucible, were provided. The crucible for the growing was made of platinum, and its surrounding was covered with a growing furnace 47 to prevent influx of the exterior atmosphere. The shape of the double crucible was such that the ratio of the height to the diameter of the outer crucible 35 was 0.45, and the ratio in diameter of the inner crucible to the outer crucible was 0.8. The outer crucible 35 had a diameter of 150 mm and a height of 67.5 mm, and the inner crucible 36 had a diameter of 120 mm and a height of 75 mm. Between the inner crucible 36 and the outer crucible 35, there was a space 34 of about 15 mm, and a material supply tube 37 was stably arranged so that a material 45 would smoothly fall to said space. The surface of the melt was observed by a video camera (not shown). Substantially no convection at the surface of the melt was observed if the crucible was not rotated, and it was observed that the forcible convection of the melt in the rotation direction became significant along with the gradual increase of the rotation speed of the crucible, and the effect of the rotation of the crucible was observed.

A crystal was grown from a melt 41 having an excessive Li component in the inner crucible. The temperature of the melt was stabilized to have a predetermined temperature by the making electric current to a high frequency oscillator 48 and by a high frequency induction coil 43, then a LN single crystal cut in Z-axis direction, having a size of 5 mm×5 mm×length 70 mm and in a monopolarization state, as a seed crystal 40, was attached to the lower part of a rotation support stick 38 and contacted with the melt 41, and the crystal was rotated and pulled upward while controlling the temperature of the melt to grow a LN single crystal 42. The growing atmosphere was in the air. The rotation speed of the LN single crystal 42 was constant within a range of from 5 to 20 rpm, and the pulling rate was changed within a range of from 0.5 to 3.0 mm/h. An automatic diameter control was carried out to the diameter of the crystal so as to prepare a wafer having a diameter of 2 inches from the grown crystal. The growth weight of the growing crystal was measured by a load cell 52, and a material 45 of the stoichiometric composition having a molar fraction of $Li_2O/(Nb_2O_5+Li_2O)$ of 0.500, in an amount corresponding to the crystal growth, was supplied to the outer crucible 35. Here, the change of the growth amount of the LN single crystal 42 was obtained by a computer 49, and the supply of the material 45 was initiated when the growing of the single crystal 42 from the LN seed crystal 40 was initiated and the 15 diameter control was stabilized. The supply of the material 45 was carried out in such a manner that the material 45 preliminarily preserved in a closed container 46 equipped with a weight measuring sensor and arranged on the growing furnace 47, was supplied through the supply tube 37 made of ceramics or a noble metal. A gas 51 was flowed to the supply tube 37 and the closed container 46 at a rate of from 50 to 500 cc/min through a gas tube 33 equipped with a valve. The flow rate of the gas 51 was optimized by the particle size and the amount per unit time of the material 45 to be supplied. By the gas flow, a smooth supply of the material was carried out without scattering or clogging of the supply tube 37. During the growing, the noble metal double crucible was rotated to forcibly control the convection of the melt so that the crystal growth interface was flat or convex to the liquid surface, simultaneously with homogenization of the melt and the powder material supplied. With respect to each composition, by growing of about 1.5 weeks, a colorless and transparent LN crystal having a diameter of 60 mm and a length of 110 mm and having no crack was obtained.

With respect to each crystal obtained, the molar fraction of $Li_2O/(Nb_2O_5+Li_2O)$ was obtained by chemical analysis. For the determination of the measurement positions in each sample, measurement position a was a position on the center axis of the crystal distanced by 15 mm from the seed crystal, and three additional measurement positions b, c and d were taken along the center axis at positions distanced by every 10 mm from the position a in the direction away from the seed crystal. Each measurement sample was cut into 7 mm cubes centering the measurement position. The results for measuring the molar fraction of $Li_2O/(Nb_2O_5+Li_2O)$ are shown in Table 1. It is difficult to obtain the absolute value of the composition ratio with a high accuracy by chemical analysis, and in the case of the LN crystal, there would be an error of a level of from 0.001 to 0.005 in the molar fraction of $Li_2O/(Nb_2O_5+Li_2O)$. Accordingly, with respect to the LN crystal of a composition in the vicinity of the stoichiometric composition, the composition was extremely carefully analyzed. The results in Table 1 are average values obtained by evaluation by means of several analyzers with respect to several positions in the same sample. As a result, in the case of the LN single crystal, the molar fraction of $Li_2O/(Nb_2O_5+Li_2O)$ did not exceed 0.005 in the crystal having e.g. Mg added thereto, even if the crystal had a composition in the vicinity of the stoichiometric composition. Further, measurements of these samples were carried out also with respect to the Mg content, and it was confirmed that the Mg content in the crystal was substantially the same as the concentration of Mg added to the melt.

TABLE 1

Molar fraction of Li$_2$O/(Nb$_2$O$_5$ + Li$_2$O)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| a | 0.492 | 0.494 | 0.496 | 0.498 | 0.496 | 0.494 | 0.492 | 0.489 |
| b | 0.493 | 0.493 | 0.495 | 0.499 | 0.498 | 0.495 | 0.492 | 0.490 |
| c | 0.494 | 0.494 | 0.496 | 0.498 | 0.497 | 0.495 | 0.491 | 0.491 |
| d | 0.494 | 0.496 | 0.494 | 0.497 | 0.495 | 0.495 | 0.492 | 0.490 |

Then, the nonlinear optical constant was measured with respect to these samples. The absolute value of the nonlinear optical constant was accurately determined by carrying out absolute measuring by using wedge method, and by carrying out analysis considering the effect of the multiple reflection to the measured data. As a result, it was found that most of the conventional values with respect to a substance having a high refractive index (n>2) such as the LN single crystal, were overestimated, and by measuring $d_{33}$ of the LN crystal of the congruent melting composition, a value of 25.1 pm/V which corresponds to the result obtained in the literature, was obtained. The laser light used for the measurement had a wavelength of single longitudinal mode continuous oscillation of 1.064 μm. The results of the measurement are shown in Table 2. In the case where Mg was added in an amount of at least 0.1 mol %, values were all at least 30.0 pm/V, despite of significant deviation of the molar fraction of the crystal of Li$_2$O/(Nb$_2$O$_5$+Li$_2$O) within a range of from 0.489 to 0.499. On the other hand, in the case where Mg was added in an amount of less than 0.1 mol %, the nonlinear optical constant tends to be slightly poor as compared with the case where the addition amount of Mg was at least 0.1 mol %. By absolute measuring method by using the wedge method, a diagonal component such as $d_{33}$ can be measured, which can not be measured by conventional absolute measuring method by means of phase matching. Further, it is extremely difficult to carry out strict analysis considering the multiple reflection by rotation maker fringe method, and an accurate nonlinear optical constant can be obtained only by carrying out nonreflection coating to measure under such a condition that no multiple reflection would take place. Accordingly, it can be stated that the absolute measuring by wedge method is an extremely effective measuring means.

for polarization inversion of the crystal was measured. The results are shown in Table 3. The voltage was at most 3.7 kV/mm in all cases where Mg was added in an amount of at least 0.1 mol %, and when Mg was added in an amount of at least 0.2 mol %, smaller values constant in the vicinity of 3.1 kV/mm were obtained. It is considered that in such crystals, the internal electric field was hardly observed, the hysteresis curve (P-E curve) of the ferroelectric had excellent symmetry, and the rising of the P-E curve was good near the anti-electric field, and accordingly there was a small deviation among the measured values. On the other hand, in the crystals having Mg added in an amount of less than 0.1 mol %, the polarization inversion voltage tended to be slightly high as compared with the crystal having Mg added in an amount of at least 0.1 mol %. On the other hand, in the case where Mg was added in an amount of at least 5 mol %, although the polarization inversion tended to be small, deviation among the samples tended to be large. This is considered to be because the rising of the P-E curve of the ferroelectric was gentle and poor near the anti-electric field, whereby it became difficult to measure the absolute value of the polarization inversion voltage, and to be because of the electrical resistance of the material. Further, the inversion voltage of the crystal of the congruent melting composition was measured under the same measurement conditions with the same shape of the samples, whereupon measurement was difficult in some cases. Measurement could be carried out with thin samples having a thickness of a level of from 0.2 to 0.5 mm, and an extremely high value of 21.0 kV/mm was obtained.

TABLE 2

Nonlinear optical constant $d_{33}$ (unit: pm/V)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| a | 27.9 | 29.5 | 30.1 | 30.2 | 30.1 | 30.1 | 30.3 | 30.3 |
| b | 28.8 | 29.5 | 30.0 | 30.3 | 30.0 | 30.4 | 30.2 | 30.1 |
| c | 29.0 | 29.6 | 30.0 | 30.2 | 30.1 | 30.3 | 30.2 | 30.0 |
| d | 29.1 | 29.6 | 30.2 | 30.1 | 30.3 | 30.1 | 30.1 | 30.1 |

Then, with respect to each single crystal obtained in the same manner as mentioned above, z-plate samples having a cross-section of 10 mm×10 mm and a thickness of 1.0 mm were cut from the measurement positions a to d.

Electrodes were formed on both z-axis surfaces, and voltage was applied thereto, whereupon the voltage required

TABLE 3

Inversion voltage (unit: kV/mm)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| a | 5.2 | 3.8 | 3.3 | 3.1 | 3.0 | 3.1 | 3.0 | 2.3 |
| b | 5.0 | 3.9 | 3.4 | 2.8 | 3.0 | 2.9 | 3.1 | 2.9 |
| c | 4.9 | 3.9 | 3.3 | 2.9 | 3.0 | 3.1 | 3.1 | 2.1 |
| d | 4.8 | 3.8 | 3.3 | 3.0 | 3.1 | 3.1 | 3.1 | 2.5 |

Then, from each single crystal obtained in the same manner as mentioned above, samples of 5 mm×3 mm×2 mm in x, y and z azimuths respectively, were cut from the measurement positions a to d. Electrodes were formed on both z-axis surfaces, and the electrooptical constants of the samples were measured by using a Mach-Zehnder interferometer. The results are shown in Table 4. As shown in Table 4, it was clarified that some of these constants were extremely sensitive to the crystal composition. Namely, with respect to a LN single crystal having a molar fraction of $Li_2O/(Nb_2O_5+Li_2O)$ of at least 0.490 and less than 0.500, the electrooptical constant $r_{13}$ would not increase as compared with the conventional LN single crystal of the congruent melting composition, however, $r_{33}$ would increase by at least about 20% to be about 36 pm/V, which is extremely high as compared with the value of about 31.5 pm/V of the LN single crystal of the congruent melting composition. Particularly with respect to the electrooptical constant, such a tendency was observed that the closer to the stoichiometric composition, the higher the constant. Further, with respect to the crystal having Mg added thereto, the electrooptical constant further increased to be at least 38 pm/V in the case where Mg was added in an amount of at least 0.1 mol %, and the maximum value of 39.5 pm/V was obtained in the crystal having Mg added in an amount of about 1 mol %. On the other hand, the electrooptical constant tended to gradually decrease along with the increase of the addition amount of Mg exceeding 1 mol %.

MgO was preliminarily filled in the crucible when the material stick was filled. With respect to the weight of $MgCO_3$ or MgO to be filled, five experiments were carried out wherein the Mg concentration in the melt was 0.1, 0.2, 0.5, 1.0 or 3.0 mol % (mol % is defined by [Mg]/([Mg]+[Li]+[Nb])×100 mol %). Further, experiments were carried out in the same manner except that $MgCO_3$ or MgO was not added, or the Mg concentration was 0.05 or 0.5 mol %, for comparison. The crucible used for the growing was made of platinum, and had a cylindrical shape, a diameter of 150 mm and a height of 100 mm. The surface of the melt was observed by a video camera throughout the growing. A significant melt convection was observed even when the crucible was not rotated, which was not seen in Example 1.

A crystal was grown from the surface of the melt at the center portion of the crucible. The temperature of the melt was stabilized to have a predetermined temperature, then a LN single crystal cut in Z-axis direction, having a size of 5 mm×5 mm×length 70 mm, and in a monopolarization state, as a seed crystal 60, was contacted with the melt, and the crystal was rotated and pulled upward while controlling the temperature of the melt, to grow a single crystal. The

TABLE 4

Electrooptical constant $r_{33}$ (unit: pm/V)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| a | 36.0 | 36.7 | 38.1 | 38.5 | 38.8 | 39.2 | 38.4 | 36.9 |
| b | 36.2 | 37.0 | 38.0 | 38.4 | 38.6 | 39.5 | 38.6 | 37.1 |
| c | 37.1 | 37.8 | 38.1 | 38.4 | 38.8 | 39.3 | 38.3 | 36.5 |
| d | 37.8 | 37.6 | 38.1 | 38.3 | 39.0 | 39.2 | 38.2 | 36.4 |

EXAMPLE 2

Figure 3:
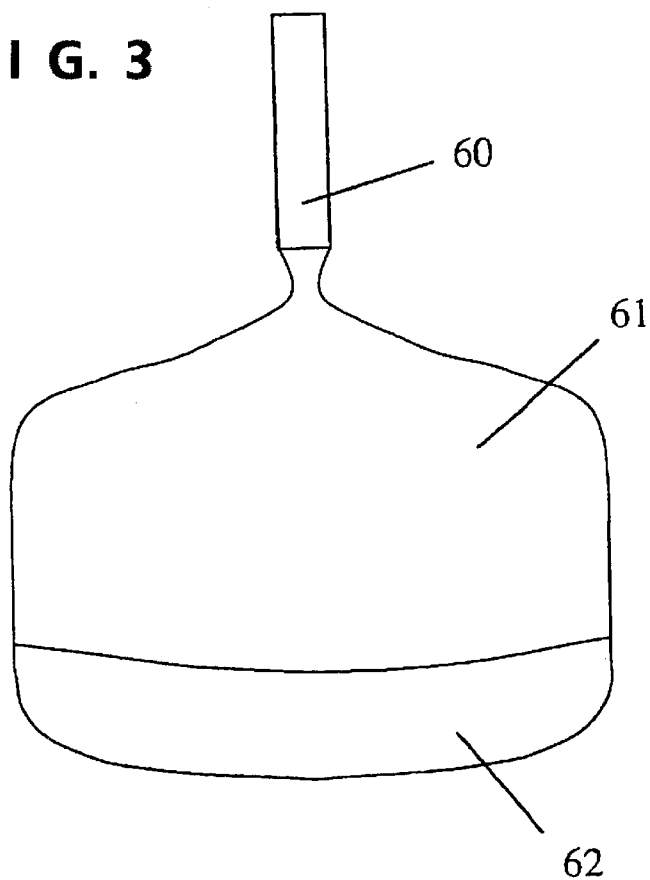
FIG. 3 is a schematic diagram illustrating the state of a LN single crystal when a single crucible is used.

Commercially available high purity material powders of $Li_2O$ and $Nb_2O_5$ were mixed to prepare a material having an excessive Li component with a ratio of $Li_2O:Nb_2O_5$ of 0.56–0.60:0.44–0.40. The mixture was subjected to rubber pressing under a hydrostatic pressure of 1 ton/cm², and calcination in the atmosphere of about 1,050° C., to prepare a material stick. Then, to grow a single crystal by single crucible method, i.e. by conventional CZ method, the prepared material stick of the material having an excessive Li component, was preliminarily filled in a crucible, and the crucible was heated to prepare a melt having an excessive Li component. In experiments to confirm the effect of Mg addition, commercially available high purity $MgCO_3$ or crucible was not rotated but fixed. The growing atmosphere was in the air. The rotation speed of the crystal was constant at 2 rpm, and the pulling rate was changed within a range of from 0.5 to 3.0 mm/h. The weight of the crystal growth was measured by a load cell throughout the growing so as to prepare a wafer having a diameter of 2 inches from the grown crystal, and an automatic diameter control was carried out immediately after the seeding so that the diameter of the crystal was about 60 mm. For the growing in the present Example, no supply of the material during the growing, as in the case of using the double crucible in Example 1, was carried out. The schematic view illustrating the obtained LN single crystal is shown in FIG. 3. In both case where no Mg was added and the case where Mg was added in each concentration, when pulling was carried out with a diameter of 60 mm, a transparent single crystal portion 61 was grown immediately after the initiation of the growing until the crystal had grown to have a length of about 30 mm. Then, the eutectic point was attained, and the portion which was pulled after the eutectic point was attained, was not the LN single crystal but a ceramic layer 62.

With respect to each crystal obtained, the molar fraction of $Li_2O/(Nb_2O_5+Li_2O)$ was obtained from chemical analysis. For the determination of measurement positions, measurement position g was a position on the center axis of the crystal distanced by 5 mm from the seed crystal 60, and two additional measurement positions h and i were taken along the center axis at positions distanced by every 10 mm from the position g in the direction away from the seed crystal. Each measurement sample was cut into 7 mm cubes centering the measurement positions. The results of measuring the molar fraction of $Li_2O/(Nb_2O_5+Li_2O)$ are shown in Table 5. Further, the samples were measured with respect to the Mg content, and it was confirmed that the Mg content in the crystal was substantially the same as the concentration of Mg added to the melt.

TABLE 5

Molar fraction of $Li_2O/(NbO_5 + Li_2O)$

|   | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| g | 0.489 | 0.489 | 0.491 | 0.495 | 0.495 | 0.491 | 0.491 | 0.490 |
| h | 0.491 | 0.494 | 0.495 | 0.498 | 0.496 | 0.492 | 0.492 | 0.494 |
| i | 0.498 | 0.496 | 0.497 | 0.499 | 0.498 | 0.494 | 0.496 | 0.496 |

Then, the nonlinear optical constants of these samples were measured by using wedge method. The results of the measurements are shown in Table 6. As shown in Table 6, it is evident that in the case where the amount of Mg was less than 0.1 mol %, the nonlinear optical constant $d_{33}$ gradually increased from the portion close to the seed crystal to the portion of eutectic point. This increase is considered to be attributable to the fact that the material was not supplied during the growing, whereby the composition ratio of the melt changed with time. On the other hand, in the case where the addition amount of Mg was at least 0.1 mol %, such an increase shown in the case where the amount was less than 0.1 mol %, was not observed. The nonlinear optical constant $d_{33}$ was substantially constant among the measurement positions g to i with distance of 10 mm, and when the amount was at least 0.2 mol %, the entire crystal substantially uniformly showed the maximum value of at least 30 pm/V.

TABLE 6

Nonlinear optical constant $d_{33}$ (unit: pm/V)

|   | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| g | 25.9 | 27.0 | 29.5 | 30.0 | 30.1 | 29.9 | 30.1 | 29.5 |
| h | 27.5 | 28.2 | 30.1 | 30.2 | 30.0 | 30.2 | 30.0 | 29.9 |
| i | 29.6 | 29.5 | 30.0 | 30.1 | 30.1 | 30.1 | 30.1 | 30.1 |

Then, single crystals were produced in the same manner as mentioned above, and z-plate samples having a cross-section of 10 mm×10 mm and a thickness of 1.0 mm were cut from the measurement positions g to i. Electrodes were formed on both z-axis surfaces, and voltage was applied thereto, whereupon the voltage required for the polarization inversion of the crystal was measured. The results of the measurements are shown in Table 7. From Table 7, it was found that the polarization inversion voltage gradually decreased from the portion close to the seed crystal toward the portion of the eutectic point, in the case where the addition amount of Mg was less than 0.1 mol %. This decrease is considered to be attributable to the fact that the material was not supplied during the growing, whereby the composition ratio of the melt changed with time. On the other hand, in the case where the addition amount of Mg was at least 0.1 mol %, such a decrease as shown in the case where it was less than 0.1 mol %, was not observed, the inversion voltage was at most 0.5 kV/mm among the measurement positions g to i with a distance of 10 mm, and when the addition amount was at least 0.2 mol %, the entire crystal substantially uniformly showed the minimum value of 3.1 kV/mm.

izations were connected with each other in many portions. This is considered to be attributable to the fact that since the Mg concentration was too high, the electrical resistance decreased and minute application of periodic voltage became difficult, whereby the crystal became heterogeneous, and portions containing a particularly large amount of Mg inhibited the linearity of the polarization inversion. Namely, it is preferred to adjust the concentration of Mg to be at most 3 mol %, in the case of preparing an element for polarization inversion.

EXAMPLE 4

Optical functional elements having a polarization inversion grating were prepared in the same manner as in

TABLE 7

| | Inversion voltage (unit: kV/mm) | | | | | | | |
|---|---|---|---|---|---|---|---|---|
| | Not added | 0.05 mol % | 0.10 mol % | 0.20 mol % | 0.50 mol % | 1.00 mol % | 3.00 mol % | 5.00 mol % |
| g | 7.0 | 5.0 | 3.6 | 3.1 | 3.1 | 3.1 | 3.1 | 2.9 |
| h | 5.2 | 3.8 | 3.3 | 3.1 | 3.1 | 3.1 | 3.1 | 3.0 |
| i | 3.1 | 3.1 | 3.1 | 3.1 | 3.1 | 3.1 | 3.1 | 2.6 |

EXAMPLE 3

Various optical functional elements were prepared by periodical inverting polarization of the LN single crystals obtained in the same manner as in Example 1. Here, preparation of a QPM element generating blue or green light to the fundamental wave of near infrared light having a wavelength of 840 nm or 1,064 nm, will be shown below. Wafers were cut from each of the crystals having Mg added in each concentration, obtained in Example 1. The wafers had a diameter of 2 inches and a thickness of 0.3 mm, 0.5 mm, 1.0 mm, 2.0 mm or 3.0 mm. Polishing was applied to both sides, and the wafers were cut into z-axis azimuth, and a pectinate pattern was formed with an electrode of a Cr film having a thickness of 500 nm on the +z surface by means of lithography. The periods of the electrode were 3.0 $\mu$m and 6.8 $\mu$m to obtain a primary QPM structure so as to generate a harmonic of blue and green light with a high efficiency. Then, an insulating film having a thickness of 0.5 $\mu$m was overcoated on the +z surface, followed by preservation treatment at a temperature of 350° C. for 8 hours. Then, the crystal was sandwiched between the electrodes by means of an aqueous lithium chloride electrolyte on both z-surfaces, and a high voltage pulse was applied thereto. The current through the LN single crystal was monitored with a resistance of 1 k$\Omega$.

A polarization inversion grating was formed, and then the y-surfaces of the crystal to be side surfaces, were polished and etched by a mixed solution of hydrofluoric acid and nitric acid, and the appearance of the polarization inversion grating was observed. The pulse duration and the electric current of the applied voltage were optimized by repeating the polarization inversion and the observation with respect to each sample, to adjust the polarization inversion grating width ratio and the mode of the polarizations inversion to be ideal 1:1 (1:0.95–1) over all samples.

As a result of the experiments, a polarization inversion grating width ratio of substantially 1:1 was obtained with respect to most samples having a thickness of 0.3 mm, 0.5 mm, 1.0 mm, 2.0 mm or 3.0 mm. However, the ratio of substantially 1:1 could not be obtained with respect to the crystal having a Mg concentration of higher than 3 mol %. Specifically, such a tendency was observed that linearity of the polarization inversion was poor, and the adjacent polar- Example 3 except that the diameter was 2 inches and the thickness was 1.0 mm. In order to obtain the polarization inversion grating width of 5 $\mu$m, the polarization inversion grating width ratio was adjusted to be close to ideal 1:1 (1:0.95–1). As a result of experiments, the polarization inversion grating width ratio of substantially 1:1 (1:0.95–1) could be obtained with respect to most samples, however, it could not be obtained with respect to the crystal having a Mg concentration of higher than 3 mol %.

EXAMPLE 5

A polarization inversion structure of a lens or a prism was formed on the LN single crystal prepared in Example 1, to prepare an optical element such as a cylindrical lens, a beam scanner or a switch or a polarization element utilizing the electrooptical effect. A LN single crystal having a diameter of 2 inches and a thickness of from 0.2 to 2.0 mm, having both surfaces polished and z-cut, was prepared, and Al electrodes of about 200 $\mu$m were formed by sputtering and a pattern of a lens or a prism was formed by means of lithography on both z-surfaces. Then, a pulse voltage of about 3.5 KV/mm was applied to the +z-surface for polarization inversion. Further, heat treatment was applied at 500° C. for about 5 hours in the air, to eliminate non-uniformity of the refractive index introduced by the polarization inversion. Further, mirror polishing was applied to the edge surface of the crystal, to obtain the incoming and outgoing face for laser light. The performances of the optical element utilizing the electrooptical effect of the LN single crystal forming inversion of the refractive index by the polarization inversion structure made by way of trial, were determined by the design for the polarization inversion structure of a lens or a prism, the accuracy of the preparation process for the polarization inversion structure, or the degree of the electrooptical constant which the material had. Here, the polarization inversion structure of the pattern of a lens or a prism was characterized by that good element characteristics were obtained since the polarization inversion was extremely easily controlled. With respect to the conventional LN crystal of the congruent melting composition, a large applied voltage was required for polarization inversion, whereby it has been difficult to control the polarization inversion structure. Further, with respect to the conventional LN crystal of the congruent melting composition or the LN single crystal having at least 5 mol % of MgO added thereto, the inversion of the spontaneous polarization was poorly controlled, whereby it has been difficult to form a polarization inversion structure of a lens or a prism with a high accuracy. Such problems were not observed in the case where an optical element such as a cylindrical lens, a beam scanner or a switch or a polarization element utilizing the electrooptical effect, was prepared by forming a polarization inversion structure of a lens or a prism on the LN single crystal prepared in Example 1. Further, the crystal of Example 1 had an electrooptical constant $r_{33}$ higher than that of the crystal of the congruent melting composition, whereby more excellent device performance was obtained with a smaller operating voltage. For example, in the case of the polarization element, a large polarization angle of about 6° was obtained with a voltage of about 600 V/mm. Further, a lens operating in the vicinity of about 100 V/mm and a switching operation at about 500 V/mm were obtained.

In the above Examples, the voltage applying method has been described in detail as Examples illustrating the polarization inversion at a temperature lower than the curie point. However, according to the present invention, an optical element having a periodic polarization inversion grating formed with a high accuracy will be realized by using a LN single crystal of the stoichiometric composition excellent in controlling and the level of performance of the crystal, even by employing another method such as 1) Ti internal dispersion method, 2) $SiO_2$ loading heat treatment method, 3) proton exchange heat treatment method, or 4) electron beam scanning irradiation method.

Further, detailed explanation has been made with respect to Examples wherein the QPM element generating blue or green light to the fundamental wave of infrared light having a wavelength of 840 nm or 1,064 nm was prepared. However, according to the present invention, the fundamental wave is not restricted to the two wavelengths, and the present invention may be applied to the longer wavelength region at which the LN single crystal is transparent and the phase matching can be carried out. Further, the optical functional element of the present invention for periodically inverting the polarization structure of the single crystal of lithium niobate, and changing the wavelength of the incoming laser having a wavelength at from visible to near infrared region, to be shorter or larger, can be applied to not only a second harmonic generating element but also an optical parametric oscillating element in various fields for e.g. remote sensing and gas detecting.

EXAMPLE 6

Commercially available high purity material powders of $Li_2O$ and $Ta_2O_5$ were mixed to prepare a material having an excessive Li component and having a ratio of $Li_2O:Ta_2O_5$ of 0.56–0.60:0.44–0.40, and a material of the stoichiometric composition of $Li_2O:Ta_2O_5$:0.50:0.50. The mixtures were subjected to rubber pressing under a hydrostatic pressure of 1 ton/cm², and calcination in the atmosphere of about 1,050° C. to prepare material sticks. Further, the mixed material of the stoichiometric composition to be a material for continuous supply, was calcinated in the atmosphere of about 1,150° C., pulverized and classified into a size within a range of from 50 to 500 μm. Then, to grow a single crystal by double crucible method, the material stick of the material having an excessive Li component was preliminarily filled in an inner crucible and an outer crucible, and the crucible was heated to prepare a melt having an excessive Li component. In experiments to confirm the effect of Mg addition, commercially available high purity MgO or $MgCO_3$ was preliminarily filled in the inner crucible and the outer crucible when the above material stick was filled. With respect to the weight of MgO or $MgCO_3$ to be filled, five experiments were carried out wherein the Mg concentration in the melt was 0.1, 0.2, 0.5, 1.0 or 3.0 mol %, (mol % is defined by [Mg]/([Mg]+[Li]+[Ta])×100 mol %). Further, experiments were carried out wherein the Mg concentration was 0, 0.05 or 5.0 mol %, for comparison.

Here, the principle of the double crucible method for growing the LT crystal of the stoichiometric composition will be explained. The LT single crystal obtained by conventional pulling method from a melt of the congruent melting composition of the LT single crystal will have excessive Ta component, however, when a crystal is grown from a melt of a composition having a significantly excessive Li component (e.g. the molar fraction of $Li_2O/(Ta_2O_5+Li_2O)$ of from 0.56 to 0.60), a single crystal of a composition in the vicinity of the stoichiometric composition with a molar fraction of $Li_2O/(Ta_2O_5+Li_2O)$ of 0.500, i.e. a single crystal having the nonstoichiometric defect concentration of as low as possible, can be obtained.

FIG. 1 illustrates an apparatus for producing an oxide single crystal used in the present invention. The double crucible used in the present Example had such a structure that in an outer crucible 35, a cylinder 36 (hereinafter referred to as inner crucible) having a height higher by 7.5 mm than the outer crucible was arranged, and at the bottom of the inner crucible, three large holes having an approximate quadrangular shape and a size of about 20 mm x about 30 mm, for connecting the outer crucible with the inner crucible, were provided. The crucible used for the growing was made of iridium, and its surrounding was covered with a growing furnace 47 to prevent influx of the exterior atmosphere. The shape of the double crucible was such that the ratio of the height to the diameter of the outer crucible 35 was 0.45, and the ratio in diameter of the inner crucible to the outer crucible was 0.8. The outer crucible 35 had a diameter of 150 mm and a height of 67.5 mm, and the inner crucible 36 had a diameter of 120 mm and a height of 75 mm. Between the inner crucible 36 and the outer crucible 35, there was a space 34 of about 15 mm, and a material supply tube 37 was stably arranged so that a material 45 would smoothly fall to said space. The surface of the melt was observed by a video camera (not shown). Substantially no convection at the surface of the melt was observed if the crucible was not rotated, and it was observed that the forcible convection of the melt in the rotation direction became significant along with the gradual increase of the rotation speed of the crucible, and the effect of the rotation of the crucible was observed.

A crystal was grown from a melt 41 having an excessive Li component in the inner crucible. The temperature of the melt was stabilized to have a predetermined temperature by the making electric current to a high frequency oscillator 48 and by a high frequency induction coil 43, then a LT single crystal cut in Z-axis direction, having a size of 5 mm×5 mm×length 70 mm and in a monopolarization state, as a seed crystal 40, was attached to the lower part of a rotation support stick 38 and contacted with the melt 41, and the crystal was rotated and pulled upward while controlling the temperature of the melt to grow a LT single crystal 42. The growing atmosphere was nitrogen containing oxygen in an amount of 1%. The rotation speed of the LT single crystal 42 was constant within a range of from 5 to 20 rpm, and the pulling rate was changed within a range of from 0.5 to 3.0 mm/h. An automatic diameter control was carried out to the diameter of the crystal so as to prepare a wafer having a diameter of 2 inches from the grown crystal. The growth weight of the growing crystal was measured by a load cell 52, and a material 45 of the stoichiometric composition having a molar fraction of $Li_2O/(Ta_2O_5+Li_2O)$ of 0.500, in an amount corresponding to the crystal growth, was supplied to the outer crucible 35. Here, the change in the growth amount of the LT single crystal 42 was obtained by a computer 49, and the supply of the material 45 was initiated when the growing of the single crystal 42 from the LT seed crystal 40 was initiated and the diameter control was stabilized. The supply of the material 45 was carried out in such a manner that the material 45 preliminarily preserved in a closed container 46 equipped with a weight measuring sensor and arranged on the growing furnace 47, was supplied through the supply tube 37 made of ceramics or a noble metal. A gas 51 was flowed to the supply tube 37 and the closed container 46 at a rate of from 50 to 500 cc/min through a gas tube 33 equipped with a valve. The flow rate of the gas 51 was optimized by the particle size and the amount per unit time of the material 45 to be supplied. By the gas flow, a smooth supply of the material was carried out without scattering or clogging of the supply tube 37. During the growing, the noble metal double crucible was rotated to forcibly control the convection of the melt so that the crystal growth interface was flat or convex to the liquid surface, simultaneously with homogenization of the melt and the powder material supplied. With respect to each composition, by growing of about 1.5 weeks, a colorless and transparent LT crystal having a diameter of 60 mm and a length of 110 mm and having no crack was obtained.

With respect to each crystal obtained, the molar fraction of $Li_2O/(Ta_2O_5+Li_2O)$ was obtained by chemical analysis. For the determination of the measurement positions in each sample, measurement position a was a position on the center axis of the crystal distanced by 15 mm from the seed crystal, and three additional measurement positions b, c and d were taken along the center axis at positions distanced by every 10 mm from the position a in the direction away from the seed crystal. Each measurement sample was cut into 7 mm cubes centering with the measurement position. The results for measuring the molar fraction of $Li_2O/(Ta_2O_5+Li_2O)$ are shown in Table 8. It is difficult to obtain the absolute value of the composition ratio with a high accuracy by chemical analysis, and in the case of the LT crystal, there would be an error of a level of from 0.001 to 0.005 in the molar fraction of $Li_2O/(Ta_2O_5+Li_2O)$. Accordingly, with respect to the LT crystal of a composition in the vicinity of the stoichiometric composition, the composition was extremely carefully analyzed. The results in Table 8 are average values obtained by evaluation by means of several analyzers with respect to several positions in the same sample. As a result, in the case of the LT single crystal, the molar fraction of $Li_2O/(Ta_2O_5+Li_2O)$ did not exceed 0.005 in the crystal having e.g. Mg added thereto, even if the crystal had a composition in the vicinity of the stoichiometric composition. Further, measurements of these samples were carried out also with respect to the Mg content, and it was confirmed that the Mg content in the crystal was substantially the same as the concentration of Mg added to the melt.

TABLE 8

| | Molar fraction of $Li_2O/(Ta_2O_5 + Li_2O)$ | | | | | | | |
|---|---|---|---|---|---|---|---|---|
| | Not added | 0.05 mol % | 0.10 mol % | 0.20 mol % | 0.50 mol % | 1.00 mol % | 3.00 mol % | 5.00 mol % |
| a | 0.491 | 0.493 | 0.495 | 0.497 | 0.497 | 0.493 | 0.491 | 0.488 |
| b | 0.493 | 0.494 | 0.494 | 0.498 | 0.498 | 0.494 | 0.491 | 0.491 |
| c | 0.492 | 0.494 | 0.496 | 0.496 | 0.498 | 0.495 | 0.493 | 0.492 |
| d | 0.493 | 0.492 | 0.495 | 0.498 | 0.496 | 0.493 | 0.492 | 0.492 |

Then, the nonlinear optical constant was measured with respect to these samples. The absolute value of the nonlinear optical constant was accurately determined by carrying out absolute measuring by using wedge method, and by carrying out analysis considering the effect of the multiple reflection to the measured data. As a result, it was found that most of the conventional values with respect to a substance having a high refractive index (n>2) such as the LT single crystal, were overestimated, and by measuring $d_{33}$ of the LT crystal of the congruent melting composition, a value of 13.8 pm/V which corresponds to the result obtained in the literature, was obtained. The laser light used for the measurement had a wavelength of single longitudinal mode continuous oscillation of 1.064 μm. The results of the measurement are shown in Table 9. In the case where Mg was added in an amount of at least 0.1 mol %, values were all at least 16.0 pm/V, despite of significant deviation of the molar fraction of the crystal of $Li_2O/(Ta_2O_5+Li_2O)$ within a range of from 0.489 to 0.499. On the other hand, in the case where the addition amount of Mg was less than 0.1 mol %, the nonlinear optical constant tends to be slightly poor as compared with the case where the addition amount of Mg was at least 0.1 mol %. By absolute measuring method by using the wedge method, a diagonal component such as $d_{33}$ can be measured, which can not be measured by conventional absolute measuring method by means of phase matching. Further, it is extremely difficult to carry out strict analysis considering the multiple reflection by rotation maker fringe method, and an accurate nonlinear optical constant can be obtained only by carrying out nonreflection coating to measure under such a condition that no multiple reflection would take place. Accordingly, it can be stated that the absolute measuring by wedge method is an extremely effective measuring means.

TABLE 9

Nonlinear optical constant $d_{33}$ (unit: pm/V)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| a | 14.9 | 15.5 | 16.1 | 16.2 | 16.1 | 16.1 | 16.3 | 16.3 |
| b | 14.8 | 15.5 | 16.0 | 16.3 | 16.0 | 16.4 | 16.2 | 16.1 |
| c | 14.0 | 15.6 | 16.0 | 16.2 | 16.1 | 16.3 | 16.2 | 16.0 |
| d | 14.1 | 15.6 | 16.2 | 16.1 | 16.3 | 16.1 | 16.1 | 16.1 |

Then, with respect to each single crystal obtained in the same manner as mentioned above, z-plate samples having a

TABLE 10

Inversion voltage (unit: kV/mm)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| a | 4.4 | 4.1 | 3.1 | 2.1 | 2.0 | 2.1 | 2.0 | 2.3 |
| b | 4.3 | 3.7 | 3.2 | 2.8 | 2.0 | 2.9 | 2.1 | 2.9 |
| c | 4.5 | 3.8 | 3.0 | 2.9 | 2.0 | 2.1 | 2.1 | 2.1 |
| d | 4.7 | 3.6 | 3.2 | 2.0 | 2.1 | 2.1 | 2.1 | 2.5 | cross-section of 10 mm×10 mm and a thickness of 1.0 mm were cut from the measurement positions a to d. Electrodes were formed on both z-axis surfaces, and voltage was applied thereto, whereupon the voltage required for polarization inversion of the crystal was measured. The results are shown in Table 10. The voltage was at most 3.5 kV/mm in all cases where Mg was added in an amount of at least 0.1 mol %, and when Mg was added in an amount of at least 0.2 mol %, smaller values constant in the vicinity of 2.0 kV/mm were obtained. It is considered that in such crystals, the internal electric field was hardly observed, the hysteresis curve (P-E curve) of the ferroelectric had excellent symmetry, and the rising of the P-E curve was good near the anti-electric field, and accordingly there was a small deviation among the measured values. On the other hand, in the crystals having Mg added in an amount of less than 0.1 mol %, the polarization inversion voltage tended to be slightly high as compared with the crystal having Mg added in an amount of at least 0.1 mol %. On the other hand, in the case where Mg was added in an amount of at least 5 mol %, although the polarization inversion tended to be small, deviation among the samples tended to be large. This is considered to be because the rising of the P-E curve of the ferroelectric was gentle and poor near the anti-electric field, whereby it became difficult to measure the absolute value of the polarization inversion voltage, and to be because of the electrical resistance of the material. Further, the inversion voltage of the crystal of the congruent melting composition was measured under the same measurement conditions with the same shape of the samples, whereupon measurement was difficult in some cases. Measurement could be carried out with thin samples having a thickness of a level of from 0.2 to 0.5 mm, and an extremely high value of 21.0 kV/mm was obtained.

Then, from each single crystal obtained in the same manner as mentioned above, samples of 5 mm×3 mm×2 mm in x, y and z azimuths respectively, were cut from the measurement positions a to d. Electrodes were formed on both z-axis surfaces, and the electrooptical constants of the samples were measured by using a Mach-Zehnder interferometer. The results are shown in Table 11. As shown in Table 11, it was clarified that some of these constants were extremely sensitive to the crystal composition. Namely, with respect to a LT single crystal having a molar fraction of $Li_2O/(Ta_2O_5+Li_2O)$ of at least 0.490 and less than 0.500, the electrooptical constant $r_{13}$ would not increase as compared with the conventional LT single crystal of the congruent melting composition, however, $r_{33}$ would increase by at least about 6% to be about 33 pm/V, which is extremely high as compared with the value of about 32.2 pm/V of the LT single crystal of the congruent melting composition. Particularly with respect to the electrooptical constant, such a tendency was observed that the closer to the stoichiometric composition, the higher the constant. Further, with respect to the crystal having Mg added thereto, the electrooptical constant further increased to be at least 34 pm/V in the case where Mg was added in an amount of at least 0.1 mol %, and the maximum value of 35.5 pm/V was obtained in the crystal having Mg added in an amount of about 1 mol %. On the other hand, the electrooptical constant tended to gradually decrease along with the increase of the addition amount of Mg exceeding 1 mol %.

TABLE 11

| | Electrooptical constant $r_{33}$ (unit: pm/V) | | | | | | | |
|---|---|---|---|---|---|---|---|---|
| | Not added | 0.05 mol % | 0.10 mol % | 0.20 mol % | 0.50 mol % | 1.00 mol % | 3.00 mol % | 5.00 mol % |
| a | 33.0 | 33.7 | 34.1 | 34.5 | 35.1 | 35.5 | 35.4 | 35.3 |
| b | 33.2 | 33.6 | 34.0 | 34.4 | 34.7 | 35.4 | 35.2 | 35.1 |
| c | 33.1 | 33.8 | 34.1 | 34.4 | 34.8 | 35.2 | 35.3 | 35.3 |
| d | 33.2 | 33.6 | 34.1 | 34.3 | 35.0 | 35.4 | 35.2 | 35.4 |

EXAMPLE 7

Commercially available high purity material powders of $Li_2O$ and $Ta_2O_5$ were mixed to prepare a material having an excessive Li component with a ratio of $Li_2O:Ta_2O_5$ of 0.56–0.60:0.44–0.40. The mixture was subjected to rubber pressing under a hydrostatic pressure of 1 ton/cm², and calcination in the atmosphere of about 1,050° C., to prepare a material stick. Then, to grow a single crystal by single crucible method, i.e. by conventional CZ method, the prepared material stick of the material having an excessive Li component, was preliminarily filled in a crucible, and the crucible was heated to prepare a melt having an excessive Li component. In experiments to confirm the effect of Mg addition, commercially available high purity MgO or $MgCO_3$ was preliminarily filled in the crucible when the material stick was filled. With respect to the weight of MgO or $MgCO_3$ to be filled, five experiments were carried out wherein the Mg concentration in the melt was 0.1, 0.2, 0.5, 1.0 or 3.0 mol % (mol % is defined by $[Mg]/([Mg]+[Li]+[Ta])\times 100$ mol %). Further, experiments were carried out in the same manner except that MgO or $MgCO_3$ was not added, or the Mg concentration was 0.05 or 0.5 mol %, for comparison. The crucible used for the growing was made of iridium, and had a cylindrical shape, a diameter of 150 mm and a height of 100 mm. The surface of the melt was observed by a video camera throughout the growing. A significant melt convection was observed even when the crucible was not rotated, which was not seen in Example 6.

A crystal was grown from the surface of the melt at the center portion of the crucible. The temperature of the melt was stabilized to have a predetermined temperature, then a LT single crystal cut in Z-axis direction, having a size of 5 mm×5 mm×length 70 mm, and in a monopolarization state, as a seed crystal 60, was contacted with the melt, and the crystal was rotated and pulled upward while controlling the temperature of the melt, to grow a single crystal. The crucible was not rotated but fixed. The growing atmosphere was nitrogen containing oxygen in an amount of 1%. The rotation speed of the crystal was constant at 2 rpm, and the pulling rate was changed within a range of from 0.5 to 3.0 mm/h. The weight of the crystal growth was measured by a load cell throughout the growing so as to prepare a wafer having a diameter of 2 inches from the grown crystal, and an automatic diameter control was carried out immediately after the seeding so that the diameter of the crystal was about 60 mm. For the growing in the present Example, no supply of the material during the growing, as in the case of using the double crucible in Example 6, was carried out. The schematic view illustrating the obtained LT single crystal is shown in FIG. 3. In both case where no Mg was added and case where Mg was added in each concentration, when pulling was carried out with a diameter of 60 mm, a transparent single crystal portion 61 was grown immediately after the initiation of the growing until the crystal had grown to have a length of about 30 mm. Then, the eutectic point was attained, and the portion which was pulled after the eutectic point was attained, was not the LT single crystal but a polycrystal layer 62.

With respect to each crystals obtained, the molar fraction of $Li_2O/(Ta_2O_5+Li_2O)$ was obtained from chemical analysis. For the determination of measurement positions, measurement position g was a position on the center axis of the crystal distanced by 5 mm from the seed crystal 60, and two additional measurement positions h and i were taken along the center axis at positions distanced by every 10 mm from the position g in the direction away from the seed crystal. Each measurement sample was cut into 7 mm cubes centering with the measurement positions. The results of measuring the molar fraction of $Li_2O/(Ta_2O_5+Li_2O)$ are shown in Table 12. Further, the samples were measured with respect to the Mg content, and it was confirmed that the Mg content in the crystal was substantially the same as the concentration of Mg added to the melt.

TABLE 12

| | Molar fraction of $Li_2O/(Ta_2O_5 + Li_2O)$ | | | | | | | |
|---|---|---|---|---|---|---|---|---|
| | Not added | 0.05 mol % | 0.10 mol % | 0.20 mol % | 0.50 mol % | 1.00 mol % | 3.00 mol % | 5.00 mol % |
| g | 0.488 | 0.486 | 0.492 | 0.494 | 0.494 | 0.490 | 0.492 | 0.491 |
| h | 0.493 | 0.492 | 0.494 | 0.497 | 0.497 | 0.493 | 0.493 | 0.493 |
| i | 0.497 | 0.497 | 0.498 | 0.499 | 0.499 | 0.493 | 0.497 | 0.497 |

Then, the nonlinear optical constants of these samples were measured by using wedge method. The results of the measurements are shown in Table 13. As shown in Table 13, it is evident that in the case where the amount of Mg was less than 0.1 mol %, the nonlinear optical constant $d_{33}$ gradually increased from the portion close to the seed crystal to the portion of the eutectic point. This increase is considered to be attributable to the fact that the material was not supplied during the growing, whereby the composition ratio of the melt changed with time. On the other hand, in the case where the addition amount of Mg was at least 0.1 mol %, such an increase shown in the case where the amount was less than 0.1 mol %, was not observed. The nonlinear optical constant $d_{33}$ was substantially constant among the measurement positions g to i with distance of 10 mm, and when the amount was at least 0.2 mol %, the entire crystal substantially uniformly showed the maximum value of at least 15 pm/V.

TABLE 13

Nonlinear optical constant $d_{33}$ (unit: pm/V)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| g | 13.9 | 14.3 | 15.6 | 15.7 | 15.7 | 15.8 | 15.8 | 16.1 |
| h | 14.6 | 14.9 | 15.7 | 15.8 | 16.0 | 16.1 | 15.9 | 15.9 |
| i | 15.8 | 16.0 | 15.9 | 16.1 | 16.1 | 16.1 | 16.1 | 16.0 |

Then, single crystals were produced in the same manner as mentioned above, and z-plate samples having a cross-section of 10 mm×10 mm and a thickness of 1.0 mm were cut from the measurement positions g to i. Electrodes were formed on both z-axis surfaces, and the voltage was applied thereto, whereupon the voltage required for the polarization inversion of the crystal was measured. The results of the measurements are shown in Table 14. From Table 14, it was found that the polarization inversion voltage gradually decreased from the portion close to the seed crystal toward the portion of the eutectic point, in the case where the addition amount of Mg was less than 0.1 mol %. This decrease is considered to be attributable to the fact that the material was not supplied during the growing, whereby the composition ratio of the melt changed with time. On the other hand, in the case where the addition amount of Mg was at least 0.1 mol %, such a decrease as shown in the case where it was less than 0.1 mol %, was not observed, the inversion voltage was at most 0.5 kV/mm among the measurement positions g to i with a distance of 10 mm, and when the addition amount was at least 0.2 mol %, the entire crystal substantially uniformly showed the minimum value of 1.5 kV/mm.

and a high voltage pulse was applied thereto. The current through the LT single crystal was monitored with a resistance of 1 kΩ.

A polarization inversion grating was formed, and then the y-surfaces of the crystal to be side surfaces, were polished and etched by a mixed solution of hydrofluoric acid and nitric acid, and the appearance of the polarization inversion grating was observed. The pulse duration and the electric current of the applied voltage were optimized by repeating the polarization inversion and the observation with respect to each sample, to adjust the polarization inversion grating width ratio and the mode of the polarizations inversion to be ideal 1:1 (1:0.95–1) over all samples.

As a result of the experiments, a polarization inversion grating width ratio of substantially 1:1 was obtained with respect to most samples having a thickness of 0.3 mm, 0.5 mm, 1.0 mm, 2.0 mm or 3.0 mm. However, the ratio of substantially 1:1 could not be obtained with respect to the crystal having a Mg concentration of higher than 3 mol %. Specifically, such a tendency was observed that linearity of the polarization inversion was poor, and the adjacent polarizations were connected with each other in many portions. This is considered to be attributable to the fact that since the

TABLE 14

Inversion voltage (unit: kV/mm)

| | Not added | 0.05 mol % | 0.10 mol % | 0.20 mol % | 0.50 mol % | 1.00 mol % | 3.00 mol % | 5.00 mol % |
|---|---|---|---|---|---|---|---|---|
| g | 5.3 | 3.2 | 1.8 | 1.7 | 1.7 | 1.6 | 1.7 | 1.8 |
| h | 2.8 | 2.4 | 1.7 | 1.6 | 1.8 | 1.6 | 1.5 | 1.7 |
| i | 1.6 | 1.7 | 1.7 | 1.6 | 1.7 | 1.5 | 1.6 | 1.7 |

EXAMPLE 8

Various optical functional elements were prepared by periodically inverting polarization of the LT single crystals obtained in the same manner as in Example 6. Here, preparation of a QPM element generating blue or green light to the fundamental wave of near infrared light having a wavelength of 840 nm or 1,064 nm, will be shown below. Wafers were cut from each of the crystals having Mg added in each concentration, obtained in Example 6. The wafers had a diameter of 2 inches and a thickness of 0.3 mm, 0.5 mm, 1.0 mm, 2.0 mm or 3.0 mm. Polishing was applied to both sides, and the wafers were cut into z-axis azimuth, and a pectinate pattern was formed with an electrode of a Cr film having a thickness of 500 nm on the +z surface by means of lithography. The periods of the electrode were 3.0 μm and 6.8 μm to obtain a primary QPM structure so as to generate a harmonic of blue and green light with a high efficiency. Then, an insulating film having a thickness of 0.5 μm was overcoated on the +z surface, followed by preservation treatment at a temperature of 350° C. for 8 hours. Then, the crystal was sandwiched between the electrodes by means of an aqueous lithium chloride electrolyte on both z-surfaces, Mg concentration was too high, the electrical resistance decreased and minute application of periodic voltage became difficult, whereby the crystal became heterogeneous, and portions containing a particularly large amount of Mg inhibited the linearity of the polarization inversion. Namely, it is preferred to adjust the concentration of Mg to be at most 3 mol %, in the case of preparing an element for polarization inversion.

EXAMPLE 9

Optical functional elements having a polarization inversion grating were prepared in the same manner as in Example 8 except that the diameter was 2 inches and the thickness was 1.0 mm. In order to obtain the polarization inversion grating width of 5 μm, the polarization inversion grating width ratio was adjusted to be close to ideal 1:1 (1:0.95–1). As a result of experiments, the polarization inversion grating width ratio of substantially 1:1 (1:0.95–1) could be obtained with respect to most samples, however, it could not be obtained with respect to the crystal having a Mg concentration of higher than 3 mol %.

EXAMPLE 10

A polarization inversion structure of a lens or a prism was formed on the LT single crystal prepared in Example 6, to prepare an optical element such as a cylindrical lens, a beam scanner or a switch or a polarization element utilizing the electrooptical effect. A LT single crystal having a diameter of 2 inches and a thickness of from 0.2 to 2.0 mm, having both surfaces polished and z-cut, was prepared, and Al electrodes of about 200 μm were formed by sputtering and a pattern of a lens or a prism was formed by means of lithography on both z-surfaces. Then, a pulse voltage of about 3.5 KV/mm was applied to the +z-surface for polarization inversion. Further, heat treatment was applied at 500° C. for about 5 hours in the air, to eliminate non-uniformity of the refractive index introduced by the polarization inversion. Further, mirror polishing was applied to the edge surface of the crystal, to obtain the incoming and outgoing face for laser light. The performances of the optical element utilizing the electrooptical effect of the LT single crystal forming inversion of the refractive index by the polarization inversion structure made by way of trial, were determined by the design for the polarization inversion structure of a lens or a prism, the accuracy of the preparation process for the polarization inversion structure, or the degree of the electrooptical constant which the material had. Here, the polarization inversion structure of the pattern of a lens or a prism was characterized by that good element characteristics were obtained since the polarization inversion was extremely easily controlled. With respect to the conventional LT crystal of the congruent melting composition, a large applied voltage was required for polarization inversion, whereby it has been difficult to control the polarization inversion structure. Further, with respect to the conventional LT crystal of the congruent melting composition or the LT single crystal having at least 5 mol % of MgO added thereto, the inversion of the spontaneous polarization was poorly controlled, whereby it has been difficult to form a polarization inversion structure of a lens or a prism with a high accuracy. Such problems were not observed in the case where an optical element such as a cylindrical lens, a beam scanner or a switch or a polarization element utilizing the electrooptical effect, was prepared by forming a polarization inversion structure of a lens or a prism on the LT single crystal prepared in Example 6. Further, the crystal of Example 6 had an electrooptical constant $r_{33}$ higher than that of the crystal of the congruent melting composition, whereby more excellent device performance was obtained with a smaller operating voltage. For example, in the case of the polarization element, a large polarization angle of about 6° was obtained with a voltage of about 600 V/mm. Further, a lens operating in the vicinity of about 100 V/mm and a switching operation at about 500 V/mm were obtained.

In the above Examples, the voltage applying method has been described in detail as Examples illustrating the polarization inversion at a temperature lower than the curie point. However, according to the present invention, an optical element having a periodic polarization inversion grating formed with a high accuracy will be realized by using a LT single crystal of the stoichiometric composition excellent in controlling and the level of performance of the crystal, even by employing another method such as 1) Ti internal dispersion method, 2) $SiO_2$ loading heat treatment method, 3) proton exchange heat treatment method, or 4) electron beam scanning irradiation method.

Further, detailed explanation has been made with respect to Examples wherein the QPM element generating blue or green light to the fundamental wave of infrared light having a wavelength of 840 nm or 1,064 nm was prepared. However, according to the present invention, the fundamental wave is not restricted to the two wavelengths, and the present invention may be applied to the longer wavelength region at which the LT single crystal is transparent and the phase matching can be carried out. Further, the optical functional element of the present invention for periodically inverting the polarization structure of the single crystal of lithium tantalate, and changing the wavelength of the incoming laser having a wavelength at from visible to near infrared region, to be shorter or longer, can be applied to not only a second harmonic generating element but also an optical parametric oscillating element in various fields for e.g. remote sensing and gas detecting.

EXAMPLE 11

Commercially available high purity $Li_2CO_3$ and $Nb_2O_5$ material powders (purity: 99.99% respectively) were mixed in such a proportion of $Li_2CO_3:Nb_2O_5$ of 0.56–0.60:0.44–0.40, to obtain a material having an excessive Li component. Further, the material powders were mixed in such a proportion of $Li_2CO_3:Nb_2O_5$ of 0.50:0.50, to obtain a material of the stoichiometric composition. Then, the mixtures were subjected to rubber pressing under a hydrostatic pressure of 1 ton/cm and calcination in the air of about 1,050° C. to prepare materials. The mixed material of the stoichiometric composition to be a powder material for continuous supply, was further calcinated in the air of about 1,150° C. followed by pulverization, and classified into a size within a range of from 50 μm to 500 μm.

Then, the obtained material having an excessive Li component was preliminarily filled in an inner crucible and an outer crucible, and the crucible was heated to prepare a melt having an excessive Li component. A double crucible used in Example 11 had such a structure that in an outer crucible 35 arranged in a rotation pulling furnace 47, a cylinder 36 (hereinafter referred to as inner crucible) having a height higher by 7.5 mm than the outer crucible 35 was arranged, and three large holes having a size of about 20 mm×about 30 mm, for connecting the outer crucible 35 with the inner crucible 36, were provided at the bottom of the inner crucible 36 at positions symmetric to the center axis of the inner crucible 36. A platinum crucible was used for the inner crucible 36 and the outer crucible 35.

The shape of the double crucible was such that the ratio of the height to the diameter of the outer crucible 35 was 0.45, and the ratio in diameter of the inner crucible to the outer crucible was 0.8. The outer crucible 35 had a diameter of 150 mm and a height of 67.5 mm, and the inner crucible 36 had a diameter of 120 mm and a height of 75 mm. Between the inner crucible 36 and the outer crucible 35, there was a space of about 15 mm, and a material supply tube 37 was stably arranged so that the material would smoothly fall to said space.

The crucible was heated by a high frequency oscillating coil 43, and the appearance of the surface of the melt 41 was observed by a video camera. Substantially no convection was observed on the surface of the melt 41 if the crucible was not rotated. However, it was observed that forced convection of the melt 41 became significant along with the gradual increase in the rotation speed of the crucible by a crucible rotation mechanism 50, and the effect of the rotation of the crucible was confirmed.

Then, a crystal was grown from the melt 41 having an excessive Li component with a molar fraction of $Li_2O/(Nb_2O_5+Li_2O)$ of 0.59. The temperature of the melt 41 was stabilized to the predetermined temperature, then a LN single crystal cut into Z-axis direction, having a size of 5 mm×5 mm×length 70 mm and in a monopolarization state, as a seed crystal 40, was attached to a crystal pulling shaft 38 and contacted with the melt 41, and the seed crystal 40 was rotated and pulled upward by a lifting and lowering head 39 while controlling the temperature of the melt 41, to grow a single crystal. The growing atmosphere was in the air. The rotation rate of the crystal was constant at 2 rpm, and the puling rate was changed within a range of from 0.5 to 3.0 mm/h.

Automatic diameter control was carried out immediately after seeding by using a diameter controlling system 48 so that the diameter of the crystal was about 60 mm in order to prepare a wafer having a diameter of 2 inches from a grown crystal 42. The growth weight of the grown crystal 42 was measured by means of a load cell as a weight measuring sensor 44, and a material powder 45 of the stoichiometric composition with a molar fraction of $Li_2O/(Nb_2O_5+Li_2O)$ of 0.50, in an amount corresponding to the amount of crystal growth, was automatically supplied to the outer crucible 35 by means of a material supply system 49 through the supply tube 37. Here, the amount of change in the crystal growth was obtained by a computer, and the supply of the material in the same amount as the crystal growth was initiated before the diameter control was stabilized after the seeding. Accordingly, the supply rate of the material was controlled to be within a range of from about 60 to about 2,500 mg/min.

The material was supplied in such a manner that the powder material 45 preserved in a closed container 46 equipped with a weight measuring sensor and arranged on the rotation pulling furnace 47, was supplied through the supply tube 37 made of ceramics or a noble metal. The supply tube 37 was arranged so that the angle to the vertical was larger than 76°. A gas was flowed to the supply tube 37 and the closed container 46 at a rate of from 50 to 500 cc/min. The flow rate of the gas was optimized within a range of from 50 to 500 cc/min depending upon the particle size (50 to 500 $\mu$m) and the amount of the material supplied per unit time (about 60 to about 250 mg/min). In the case of growing a LN single crystal having a diameter of 2 inches, the powder material 45 selected to have a particle size of as constant as possible within a range of from 80 to 100 $\mu$m was used, and the flow rate of the gas was adjusted to be 200 cc/min, to realize a smooth supply of the material without scattering of the material powder nor the clogging of the supply tube 37.

According this method, the material was continuously and smoothly supplied to the crucible, and a crystal could be grown from the melt 41 having the depth and the composition kept to be always constant, whereby a large single crystal having a homogeneous composition and a diameter of at least 2 inches could be easily grown.

Further, by rotating the noble metal double crucible during the growing, the convection of the melt 41 was forcibly controlled so that the crystal growth interface was flat or convex to the melt surface, simultaneously with homogenization of the melt 41 and the powder material 45 supplied. Particularly in the case of growing a crystal having a diameter of at least 2 inches, if the double crucible structure is employed, the growth interface is likely to be concave in the case where the temperature gradient of the melt in the inner crucible in the diameter direction is extremely gentle. However, the growth interface could be controlled to be flat by rotating the crucible at from about 2 to about 4 rpm, or to be convex by rotating the crucible at from about 7 to about 8 rpm.

To grown a LN single crystal of high quality having a diameter of 2 inches, the entire double crucible was arranged in an alumina ceramic refractory, and the refractory having the double crucible arranged therein was arranged on a rotatable stand and rotated. The effect of the convection of the melt 41 was observed in both case where the crucible was rotated in the same direction as the rotation of the crystal and the case where the crucible was rotated in the opposite direction, and a longitudinal crystal of high quality could be pulled up stably. A colorless and transparent LN crystal having a diameter of 60 mm and a length of 110 mm and having no crack was obtained by growing of about 1.5 weeks. The obtained as-grown crystal was cut in various directions, and the inside domain state was observed, whereupon it was confirmed that the inside was in homogeneously single domain state except for negligible portion near the surface of the crystal.

Further, in the case where the double crucible was arranged so that the height of the inner crucible 36 was equal to or higher than the height of the outer crucible 35, the heating temperature at the upper part of the inner crucible 36 becomes low as compared with the outer crucible 35, and most of the melt 41 would be solidified on the wall of the inner crucible 36 during a step of cooling the melt after the pulling of the crystal had been completed, whereby the wall of the outer crucible 35 made of a noble metal was free from a solid, and accordingly, the deformation of the crucible due to application of stress was minimized.

After 10 times of continuous growing, the crucible was taken off from the alumina ceramic refractory, and the appearance was checked, whereupon the crucible was hardly deformed as compared with the shape of a new one, and it was confirmed that the outer crucible 35 was hardly deformed even after the continuous growing of 30 times. Accordingly, one crucible would be used repeatedly for more times, and the production of an oxide single crystal by using an expensive noble metal could be carried out at a significantly lower cost.

EXAMPLE 12

Commercially available high purity $Li_2CO_3$ and $Ta_2O_5$ material powders (purity: 99.99% respectively) were mixed in such a proportion of $Li_2CO_3:Ta_2O_5$ of 0.56–0.60:0.44–0.40, to obtain a material having an excessive Li component. Further, the material powders were mixed in such a proportion of $Li_2CO_3:Ta_2O_5$ of 0.50:0.50, to obtain a material of the stoichiometric composition. Then, the mixtures were subjected to rubber pressing under a hydrostatic pressure of 1 ton/cm$^2$ and calcination in the air at a temperature of about 1,050° C. to prepare material sticks. The mixed material of the stoichiometric composition to be a powder material for continuous supply, was further calcinated in the air of about 1,350° C. followed by pulverization, and classified into a size within a range of from 50 $\mu$m to 500 $\mu$m.

Then, the obtained material having an excessive Li component was preliminarily filled in an inner crucible and an outer crucible, and the crucible was heated to prepare a melt having an excessive Li component. Here, detailed phase diagram required for growing the LT crystal of the stoichiometric composition was not clarified, and presuming that it is similar to the phase diagram of the LN crystal, when a crystal was grown from a melt having a significantly excessive Li component (e.g. molar fraction of $Li_2/(Ta_2O_5+Li_2O)$:0.56–0.60), a single crystal of a composition in the vicinity of the stoichiometric composition (molar fraction of $Li_2/(Ta_2O_5+Li_2O)$:0.50), i.e. a single crystal wherein the nonstoichiometric defect concentration was suppressed to be as low as possible, will be obtained. If the composition of the crystal to be grown and the composition of the melt are different, the compositions will be more different along with the progress of the growing by the conventional pulling method, whereby it will be difficult to grow a crystal. Accordingly, the method for producing a single crystal by means of the apparatus for growing a single crystal by the double crucible method of the present invention, as schematically shown in FIG. 1, was employed in order to precisely control the structure and the density of the nonstoichiometric defects.

The structure of the double crucible in the present Example was such that in the outer crucible 35, the inner crucible 36 having a height higher by 5 mm than the outer crucible 35 was arranged, and three large holes having a size of about 15 mm×20 mm were arranged on the bottom of the inner crucible 36 at the same positions as in Example 11. An iridium crucible was used as the inner crucible 36 and the outer crucible 35. The shape of the double crucible used was such that the ratio of the height to be diameter of the outer crucible 35 was 0.50, and the ratio in diameter of the inner crucible to the outer crucible was 0.8. The outer crucible 35 had a diameter of 150 mm and a height of 75 mm, and the inner crucible 36 had a diameter of 120 mm and a height of 80 mm. Between the inner crucible 36 and the outer crucible 35, there was space of about 15 mm, and the material supply tube 37 was stably arranged so that the material would smoothly fall to said space.

The appearance of the surface of the melt 41 was observed by a video camera. A weak convection was slightly observed on the surface of the melt 41 if the crucible was not rotated. However, it was observed that the forcible convection of the melt 41 became significant along with the gradual increase of the rotation speed of the crucible, and the effect of the rotation of the crucible was confirmed.

Then, a crystal was grown from the melt 41 having an excessive Li component with a molar fraction of $Li_2O/(Ta_2O_5+Li_2O)$ of 0.60. The temperature of the melt was stabilized to the predetermined temperature, then a LT single crystal cut in Y-axis direction having a size of 5 mm×5 mm×length 50 mm as a seed crystal 40 was contacted with the melt 41, and a single crystal was grown by rotating the crystal and pulling it upward while controlling the temperature of the melt 41. The seeding temperature measured by a thermocouple arranged to a portion close to the crucible, was in the vicinity of 1,450° C. An Ir crucible was used since the growing was carried out at a high temperature, and accordingly the growing atmosphere was in the reduced atmosphere. The rotation rate of the crystal was changed within a range of from 2 to 4 rpm, and the pulling rate was changed within a range of from 0.5 to 3.0 mm/h. Automatic diameter control was carried out immediately after the seeding so that the diameter of the crystal was about 60 mm in order to prepare a wafer having a diameter of 2 inches from the grown crystal 42. The growth weight of the grown crystal 42 was measured by a load cell, and the material of the stoichiometric composition with a molar fraction of $Li_2O/(Ta_2O_5+Li_2O)$ of 0.50 was automatically supplied to the outer crucible 35 in an amount corresponding to the amount of the crystal growth. Here, the amount of change in the crystal growth was obtained by a computer, and the supply of the material in the same amount as the crystal growth was initiated before the diameter control was stabilized after the seeding. Accordingly, the supply rate of the material was controlled to be within a range of from about 120 to about 5,000 mg/min.

The material was supplied in such manner that a powder material 45 preserved in a closed container 46 equipped with a weight measuring sensor and arranged on a rotation pulling furnace 47, was supplied through the supply tube 37 made of ceramics or a noble metal. The supply tube 37 was arranged so that the angle to the vertical was at least 80°. A gas was flowed to the supply tube 37 and the closed container 46 at a rate of from 50 to 500 cc/min. The flow rate of the gas was optimized to be within a range of from 50 to 500 cc/min depending on the particle size (50 to 500 μm) and the amount of the powder material per unit time (about 120 to about 5,000 mg/min). In the case of growing a LT single crystal having a diameter of 2 inches, the supply material selected to have a particle size of as constant as possible within a range of from 100 to 200 μm, was used, and the flow rate of the gas was adjusted to be 150 cc/min, whereby the material was smoothly supplied without scattering of the powder material nor the clogging of the supply tube 37. According to this method, the material could be continuously and smoothly supplied to the crucible, and the crystal could be grown from the melt 41 having the depth and the composition kept to be always constant, and accordingly, a large single crystal having a diameter of at least 2 inches and a homogeneous composition could be grown easily.

Further, the convection of the melt 41 was forcibly controlled so that the crystal growth interface was flat or convex to the liquid surface, simultaneously with the homogenization of the melt 41 and the powder material 45 supplied, by rotating the noble metal double crucible. Particularly in the case of growing a crystal having a diameter of at least 2 inches, when the double crucible structure was employed, the growth interface was likely to be concave in the case where the temperature gradient of the melt in the inner crucible in the diameter direction was extremely gentle. However, the grown interface could be controlled to be flat or concave by rotating the crucible at from about 1 to about 3 rpm. In the case of growing the LT single crystal, the growth interface tended to be convex even if the rotation speed of the crucible was low, as compared with the case of growing the LN single crystal.

To grow a LT single crystal of high quality having a diameter of 2 inches, the entire double crucible was arranged in the zirconium refractory, and the refractory having the double crucible arranged therein was arranged on a rotatable stand and rotated. The effect of the convection of the melt 41 was observed in both case where the crucible was rotated in the same direction as the rotation of the crystal, and the case where it was rotated in the opposite direction, and a longitudinal crystal of high quality could be stably pulled up. A colorless and transparent LT crystal having a diameter of 60 mm and a length of 90 mm and having no crack was obtained by the growing of about 1.5 weeks.

Further, the iridium double crucible was arranged so that the height of the inner crucible 36 was equal to or higher than the height of the outer crucible 35, whereby the heating temperature at the upper part of the inner crucible 36 becomes lower than the outer crucible 35, and the melt 41 was solidified on the wall of the inner crucible 36 during a step of cooling the melt 41 after the pulling of the crystal had been completed, and accordingly, deformation of the outer crucible 35 made of a noble metal due to application of stress by a solid, could be minimized. After a continuous growing of 8 times, the crucible was taken out from the zirconium refractory, and the appearance was checked, whereupon the shape was hardly deformed as compared with the shape of a new one, and it was confirmed that the shape was hardly deformed even after the continuous growing of 20 times. Accordingly, the production of an oxide single crystal by using an expensive noble metal could be carried out at a significantly lower cost. Iridium is susceptible to deformation, has a poor processability, and is extremely expensive, as compared with platinum, whereby to overcome the problem of deformation by the double crucible method is significantly advantageous to produce an oxide single crystal at a low cost.

EXAMPLE 13

A single crystal was grown by applying the double crucible method to the growing of a LT single crystal of the congruent melting composition having a large diameter, which has conventionally been produced also by Czochralski method. Commercially available material powders of $Li_2CO_3$ and $Ta_2O_5$ (purity: 99.9% respectively) were mixed in the ratio of $Li_2CO_3:Ta_2O_5$ of 0.485 to prepare a material of the congruent melting composition, followed by rubber pressing under a hydrostatic pressure of 1 ton/cm² and calcination in the air of about 1,050° C. to prepare a material stick. Further, a mixed material of the stoichiometric composition to be a powder material for continuous supply was calcinated in the air of about 1,350° C., followed by pulverization, and classified into a size within a range of from 200 μm to 500 μm.

Then, the prepared material of the congruent melting composition was preliminarily filled in an inner crucible and an outer crucible, and the crucible was heated to prepare a melt. In the case of the congruent melting composition, the temperature at which the entire material melted was about 1,650° C., which was higher by about 200° C. than the case of the crystal of the stoichiometric composition.

The structure of the double crucible was such that in the outer crucible 35, the inner crucible 36 having a height of higher by 6 mm than the outer crucible 35 was arranged, and three large holes having a size of about 15 mm×about 30 mm and connecting the outer crucible 35 with the inner crucible 36, were provided on the bottom of the inner crucible 36 in the same positions as in Example 11.

In Example 13, an iridium crucible was employed. The shape of the double crucible was such that the ratio of the height to be diameter of the outer crucible 35 was 0.40, and the ratio in diameter of the inner crucible to the outer crucible was 0.8. The outer crucible 35 had a diameter of 160 mm and a height of 64 mm, and the inner crucible 36 had a diameter of 128 mm and a height of 70 mm. Between the inner crucible 36 and the outer crucible 35, there was a space of about 16 mm, and a material supply tube 37 was stably arranged so that the material would smoothly fall to said space.

The appearance of the surface of the melt 41 was observed by a video camera. A weak convection was slightly observed on the surface of the melt 41 if the crucible was not rotated, and it was observed that the forcible convection on the melt 41 became significant along with a gradual increase of the rotation speed of the crucible, and the effect of the rotation of the crucible was confirmed.

Then, a crystal was grown from the melt 41 of the congruent melting composition with a molar fraction of $Li_2O/(Ta_2O_5+Li_2O)$ of 0.485. The temperature of the melt 41 was stabilized to the predetermined temperature, and a LT single crystal cut in Y-axis direction and having a size of 8 mm×8 mm×length 70 mm as a seed crystal 40 was contacted with the melt 41, and the crystal was rotated and pulled upward while controlling the temperature of the melt 41, to grow a single crystal. The growing atmosphere was in a nitrogen atmosphere containing a small amount of oxygen. The rotation rate of the crystal was 5 rpm, and the pulling rate was from 3 to 7 mm/h.

An automatic diameter control was carried out immediately after the seeding so that the diameter of the crystal was about 85 mm in order to prepare a wafer having a diameter of 3 inches from the grown crystal 42. The growth weight of the grown crystal 42 was measured by a load cell, and the material of the congruent melting composition was automatically supplied to the outer crucible 35 in an amount corresponding to the crystal growth. Here, the composition of the growing crystal, the composition of the melt 41 and the composition of the supply material were all the same congruent melting composition, whereby the supply of the material was initiated when the diameter control was stabilized. Accordingly, the supply rate of the material was controlled within a range of from 2,000 to 5,500 mg/min.

The material was supplied in such a manner that the powder material 45 preserved in a closed container 46 equipped with a weight measuring sensor and arrange on a rotation pulling furnace 47, was supplied through a supply tube 37 made of ceramics or a noble metal. The supply tube 37 was arranged so that the angle to the vertical was about 78°. The gas was flowed to the supply tube 37 and the closed container 46 at a rate of from 100 to 500 cc/min to carry out smooth material supply. The flow rate of the gas was optimized within a range of from 100 to 200 cc/min depending upon the particle size (200 to 500 pm) and the amount of the powder material per unit time (about 2,000 to about 5,500 mg/min). In the case of growing a LT single crystal having a diameter of 3 inches, the supply material was selected to have a particle size of as large as at least 200 μm, whereby the material could be smoothly supplied without scattering of the powder material nor the clogging of the supply tube 37, with a flow rate of the gas of a level of 200 cc/min. According to this method, the material could be continuously and smoothly supplied to the crucible, and the crystal could be grown from the melt 41 having the depth always kept to be constant, whereby growing of a longitudinal and large single crystal having the depth a homogeneous composition could be easily carried out. Further, the convection of the melt 41 was forcibly controlled so that the crystal growth interface was flat or convex to the liquid surface by rotating the noble metal double crucible during the growing. Particularly in the case of growing a crystal having a diameter of at least 3 inches, if the double crucible structure was employed, the growth interface was likely to be concave in the case where the temperature gradient of the melt in the inner crucible in the diameter direction was extremely gentle, however, the growth interface could be made flat or convex by rotating the crucible. In the case of growing the LT single crystal, the growth interface tended to be convex with a lower rotation rate of the crucible as compared with the case of growing the LN single crystal. In the case of the crystal of the congruent melting composition, the growth rate was high, and the diameter was large, whereby the amount of the powder material 45 supplied was large, and accordingly, the homogenization of the melt 41 and the supply material by the rotation of the crucible was more important. A colorless and transparent LT crystal having a diameter of 85 mm and a length of 100 mm and having no crack was easily obtained by the growing of about a week.

Then, the deformation of the iridium double crucible when cooled was observed. Since the double crucible was arranged so that the height of the inner crucible 36 was equal to or higher than the height of the outer crucible 35, the melt 41 was deposited and solidified on the wall of the inner crucible 36 during a step of cooling the melt 41 after the pulling of the crystal had been completed, and accordingly the deformation of the outer crucible 35 made of a noble metal due to application of stress by a solid was minimized. After the continuous growing of several times, the crucible was taken out from the refractory, and the appearance was checked, whereupon it was confirmed that the crucible was hardly deformed as compared with the shape of a new one. Accordingly, it is expected that the production of an oxide single crystal having a large diameter by using an extremely expensive noble metal will be carried out at a significantly low cost. Iridium is susceptible to deformation, has a poor processability and is extremely expensive as compared with platinum, whereby it is considered that to overcome the problem of deformation by the double crucible method is significantly advantageous to produce an oxide single crystal at a low cost.

As mentioned above, according to the present invention, a LN crystal having the nonlinear optical constant, polarization inversion voltage and electrooptical constant which a LN crystal with a molar fraction of $Li_2O/(Nb_2O_5+Li_2O)$ of 0.500 has, will be obtained with a high efficiency, without completely adjusting the molar fraction of the LN crystal of $Li_2O/(Nb_2O_5+Li_2O)$ to be 0.500. Likewise, a LT crystal having the nonlinear optical constant, polarization inversion voltage and electrooptical constant which a LT crystal with a molar fraction of $Li_2O/(Ta_2O_5+Li_2O)$ of 0.500 has, will be obtained with a high efficiency, without completely adjusting the molar fraction of the LT crystal of $Li_2O/(Ta_2O_5+Li_2O)$ to be 0.500. By utilizing the above, a LN or LT crystal of the stoichiometric composition having the maximum frequency-conversion characteristic and electrooptical characteristic over the entire crystal, will be grown. In the above Examples, Mg was used as the third element. However, it was confirmed that the similar results were obtained by using Zn, Sc or In.

Further, according to the present invention, in the growing of a single crystal by using a high frequency induction heating, by employing a noble metal double crucible, optimizing its shape, rotating the crucible, providing a material supply apparatus and improving the method for supplying the material, a high quality crystal of the congruent melting composition or another composition, having a large diameter and being longitudinal, which has conventionally been considered to be difficult to produce, will be stably grown, and further, the problem of deformation of the crucible due to growing can be overcome, and accordingly, the process for producing an oxide single crystal at a low cost can be provided.

What is claimed is:

1. A single crystal of lithium niobate or lithium tantalate, grown from a melt of a composition having a molar excess of Li over a stoichiometric composition of lithium niobate or lithium tantalate, and having a molar fraction of $Li_2O/(Nb_2O_5+Li_2O)$ or $Li_2O/(Ta_2O_5+Li_2O)$ within a range of at least 0.490 and less than 0.500, and the single crystal has at least one element selected from the group consisting of Mg, Zn, Sc and In in an amount of from 0.1 to 3.0 mol % based on the total amount of the elements, Nb and Li, or the total amount of the elements, Ta and Li.

2. The single crystal according to claim 1, wherein the single crystal is lithium niobate.

3. The single crystal according to claim 2, which has a nonlinear optical constant $d_{33}$ of at least 26 pm/V at a wavelength of 1.064 $\mu$m.

4. The single crystal according to claim 2, wherein the applied voltage required for polarization inversion at room temperature is less than 3.7 kV/mm.

5. The single crystal according to claim 2, which has an electrooptical constant $r_{33}$ of at least 36 pm/V at a wavelength of 0.633 $\mu$m.

6. An optical element for converting the frequency of laser light comprising the single crystal of claim 2, wherein quasi phase matching is carried out in such a state that the ferroelectric polarization of the single crystal is inverted.

7. The optical element according to claim 6, which has a thickness in the Z axis direction of the element of at least 1.0 mm, and a period of polarization inversion of at most 30 $\mu$m.

8. The optical element according to claim 6, which has a period of polarization inversion of at most 5 $\mu$m.

9. An optical element for controlling laser light comprising the single crystal of claim 2, wherein polarization, focusing and switching of light are carried out by utilizing a change in refractive index of such a structure whereby the ferroelectric polarization of the single crystal is inverted.

10. The single crystal according to claim 1, wherein the crystal is lithium tantalate.

11. The single crystal according to claim 10, which has a nonlinear optical constant $d_{33}$ of at least 15 pm/V at a wavelength of 1.064 $\mu$m.

12. The single crystal according to claim 10, wherein the applied voltage required for polarization inversion at room temperature is less than 3.5 kV/mm.

13. The single crystal according to claim 10, which has an electrooptical constant $r_{33}$ of at least 34 pm/V at a wavelength of 0.633 $\mu$m.

14. An optical element for converting the frequency of laser light comprising the single crystal of claim 10, wherein quasi phase matching is carried out in such a state that the ferroelectric polarization of the single crystal is inverted.

15. The optical element according to claim 14, which has a thickness in the Z axis direction of the element of at least 1.0 mm, and a period of polarization inversion of at most 30 $\mu$m.

16. The optical element according to claim 14, which has a period of polarization inversion of at most 5 $\mu$m.

17. An optical element for controlling laser light comprising the single crystal of claim 10, wherein polarization, focusing and switching of light are carried out by utilizing a change in refractive index of such a structure whereby the ferroelectric polarization of the single crystal is inverted.

18. A single crystal of lithium niobate or lithium tantalate, grown from a melt of a composition having a molar excess of Li over a stoichiometric composition of lithium niobate or lithium tantalate, and having a molar fraction of $Li_2O/(Nb_2O_5+Li_2O)$ or $Li_2O/(Ta_2O_5+Li_2O)$ within a range of at least 0.490 and less than 0.500, and the single crystal has at least one element selected from the group consisting of Sc and In in an amount of from 0.1 to 3.0 mol % based on the total amount of the elements Nb and Li, or the total amount of the elements Ta and Li.

* * * * *